US012422719B2

(12) United States Patent
Wang et al.

(10) Patent No.: US 12,422,719 B2
(45) Date of Patent: Sep. 23, 2025

(54) DISPLAY PANEL AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ce Wang, Beijing (CN); Longhu Hao, Beijing (CN); Yao Bi, Beijing (CN); Xuan Zhong, Beijing (CN); Ning Li, Beijing (CN); Hongsheng Bi, Beijing (CN); Bangjun Song, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/557,486

(22) PCT Filed: Dec. 16, 2022

(86) PCT No.: PCT/CN2022/139710
§ 371 (c)(1),
(2) Date: Oct. 26, 2023

(87) PCT Pub. No.: WO2024/124560
PCT Pub. Date: Jun. 20, 2024

(65) Prior Publication Data
US 2025/0085598 A1  Mar. 13, 2025

(51) Int. Cl.
G02F 1/1362 (2006.01)
G02F 1/1333 (2006.01)
(Continued)

(52) U.S. Cl.
CPC .. *G02F 1/136286* (2013.01); *G02F 1/133345* (2013.01); *G02F 1/1337* (2013.01);
(Continued)

(58) Field of Classification Search
CPC ......... G02F 1/136286; G02F 1/133345; G02F 1/1337; G02F 1/134309
(Continued)

(56) References Cited

U.S. PATENT DOCUMENTS

2003/0117541 A1* 6/2003 Kim ................. G02F 1/1339
349/43
2005/0128410 A1* 6/2005 Lee .................. G02F 1/134363
349/42
(Continued)

FOREIGN PATENT DOCUMENTS

CN   101359136 A   2/2009
CN   101424804 A   5/2009
(Continued)

*Primary Examiner* — Christopher M Raabe
(74) *Attorney, Agent, or Firm* — DINSMORE & SHOHL LLP

(57) ABSTRACT

The present disclosure provides a display panel and a display device. The display panel includes: a substrate, a common electrode line, a gate line, a first insulating layer, a data line, a second insulating layer, a pixel electrode layer, a first orientation layer, a liquid crystal layer, a second orientation layer, and a common electrode layer; wherein an angle between an extending direction of the common electrode line and a rubbing direction of the first orientation layer ranges from 0 degrees to 30 degrees or from 60 degrees to 90 degrees, and an angle between an extending direction of the gate line and the rubbing direction of the first orientation layer ranges from 0 degrees to 30 degrees or from 60 degrees to 90 degrees.

19 Claims, 12 Drawing Sheets

(51) Int. Cl.
    *G02F 1/1337*     (2006.01)
    *G02F 1/1343*     (2006.01)
    *G02F 1/1368*     (2006.01)
    *H10D 86/40*     (2025.01)
    *H10D 86/60*     (2025.01)

(52) U.S. Cl.
    CPC ...... *G02F 1/134309* (2013.01); *G02F 1/1368* (2013.01); *H10D 86/441* (2025.01); *H10D 86/60* (2025.01)

(58) Field of Classification Search
    USPC .......................................................... 349/42
    See application file for complete search history.

(56) References Cited

U.S. PATENT DOCUMENTS

| | | | |
|---|---|---|---|
| 2006/0145990 A1* | 7/2006 | Kim | G02F 1/136227 |
| | | | 345/94 |
| 2009/0284705 A1 | 11/2009 | Ogura et al. | |
| 2015/0348455 A1 | 12/2015 | Jeon et al. | |
| 2019/0081086 A1 | 3/2019 | Xu et al. | |
| 2020/0272005 A1 | 8/2020 | Um et al. | |
| 2020/0341338 A1 | 10/2020 | Ma et al. | |
| 2021/0337673 A1 | 10/2021 | Eom et al. | |
| 2023/0244344 A1* | 8/2023 | Wang | G06F 3/0412 |
| | | | 345/174 |

FOREIGN PATENT DOCUMENTS

| | | |
|---|---|---|
| CN | 101581846 A | 11/2009 |
| CN | 101666949 A | 3/2010 |
| CN | 203217212 U | 9/2013 |
| CN | 105303975 A | 2/2016 |
| CN | 106486500 A | 3/2017 |
| CN | 108628045 A | 10/2018 |
| CN | 109240004 A | 1/2019 |
| CN | 113540180 A | 10/2021 |
| JP | H10170924 A | 6/1998 |
| KR | 20060001699 A | 1/2006 |

* cited by examiner

DISPLAY PANEL AND DISPLAY DEVICE

CROSS-REFERENCE TO RELATED APPLICATIONS

The present application is a U.S. National Stage Application under 35 U.S.C. § 371 of International Patent Application No. PCT/CN2022/139710, filed on Dec. 16, 2022, the disclosure of which is incorporated by reference herein in its entirety.

TECHNICAL FIELD

The present disclosure relates to a display panel and a display device.

BACKGROUND

In the display products, a twisted nematic (TN) product has always been widely applied for fast response time and high transmittance, but its contrast ratio (CR) has a significant disadvantage compared to an ADS (abbreviation of ADSDS (Advanced Super Dimension Switch)) product. In recent years, the products such as 3D (3-dimension) printing, a projector and other products have been developed, which require commonly high transmittance and fast response time. Therefore, the TN product has gradually become an option for the design idea of such products.

SUMMARY

According to an aspect of the present disclosure, a display panel is provided. The display panel comprises: a substrate; a common electrode line and a gate line on the substrate, wherein the common electrode line is isolated from the gate line; a first insulating layer covering the common electrode line and the gate line; a data line on a side of the first insulating layer away from the substrate; a second insulating layer covering the data line; a pixel electrode layer on a side of the second insulating layer away from the substrate; a first orientation layer on a side of the pixel electrode layer away from the substrate; a liquid crystal layer on a side of the first orientation layer away from the substrate; a second orientation layer on a side of the liquid crystal layer away from the substrate; and a common electrode layer on a side of the second orientation layer away from the substrate, wherein the common electrode layer is electrically connected to the common electrode line; wherein an angle between an extending direction of the common electrode line and a rubbing direction of the first orientation layer ranges from 0 degrees to 30 degrees or from 60 degrees to 90 degrees, and an angle between an extending direction of the gate line and the rubbing direction of the first orientation layer ranges from 0 degrees to 30 degrees or from 60 degrees to 90 degrees.

In some embodiments, the pixel electrode layer comprises a plurality of sub-pixel electrodes arranged in an array; and the common electrode line comprises a plurality of groups of sub-common electrode lines, the plurality of groups of sub-common electrode lines being arranged in one-to-one correspondence with the plurality of sub-pixel electrodes in a same row, and each group of the plurality of groups of sub-common electrode lines comprising a first sub-common electrode line and a second sub-common electrode line electrically connected to the first sub-common electrode line, wherein an angle between an extending direction of the first sub-common electrode line and the rubbing direction of the first orientation layer ranges from 60 degrees to 90 degrees, and an angle between an extending direction of the second sub-common electrode line and the rubbing direction of the first orientation layer ranges from 0 degrees to 30 degrees.

In some embodiments, the gate line comprises a plurality of groups of sub-gate lines, the plurality of groups of sub-gate lines being arranged in one-to-one correspondence with the plurality of sub-pixel electrodes in a same row, and each group of the plurality of groups of sub-gate lines comprising a first sub-gate line and a second sub-gate line electrically connected to the first sub-gate line, wherein an angle between an extending direction of the first sub-gate line and the rubbing direction of the first orientation layer ranges from 0 degrees to 30 degrees, and an angle between an extending direction of the second sub-gate line and the rubbing direction of the first orientation layer ranges from 60 degrees to 90 degrees.

In some embodiments, each of the plurality of sub-pixel electrodes comprises a first edge, a second edge adjacent to the first edge, a third edge opposite to the first edge and a fourth edge opposite to the second edge, wherein the extending direction of the first sub-common electrode line is the same as an extending direction of the first edge, the extending direction of the second sub-common electrode line is the same as an extending direction of the second edge, the extending direction of the first sub-gate line is the same as an extending direction of the fourth edge, and the extending direction of the second sub-gate line is the same as an extending direction of the third edge.

In some embodiments, an orthographic projection of the first sub-common electrode line on the substrate does not overlap with an orthographic projection of a sub-pixel electrode corresponding to the first sub-common electrode line on the substrate; and an orthographic projection of the second sub-common electrode line on the substrate at least partially overlaps with an orthographic projection of a sub-pixel electrode corresponding to the second sub-common electrode line on the substrate.

In some embodiments, an orthographic projection of the first sub-gate line on the substrate does not overlap with an orthographic projection of a sub-pixel electrode corresponding to the first sub-gate line on the substrate; and an orthographic projection of the second sub-gate line on the substrate at least partially overlaps with an orthographic projection of a sub-pixel electrode corresponding to the second sub-gate line on the substrate.

In some embodiments, the each group of the plurality of groups of sub-common electrode lines further comprises a first connection portion connected between the first sub-common electrode line and the second sub-common electrode line.

In some embodiments, the each group of the plurality of groups of sub-gate lines further comprises a second connection portion connected between the first sub-gate line and the second sub-gate line.

In some embodiments, the extending direction of the common electrode line is substantially parallel or perpendicular to the rubbing direction of the first orientation layer, and the extending direction of the gate line is substantially parallel or perpendicular to the rubbing direction of the first orientation layer.

In some embodiments, a shape of each of the plurality of sub-pixel electrodes is a parallelogram.

In some embodiments, the shape of the each of the plurality of sub-pixel electrodes is a rhombus.

In some embodiments, the data line comprises a plurality of groups of sub-data lines, the plurality of groups of sub-data lines being arranged in one-to-one correspondence with the plurality of sub-pixel electrodes in a same column, and each group of the plurality of groups of sub-data lines comprising a first sub-data line and a second sub-data line electrically connected to the first sub-data line, wherein an extending direction of the first sub-data line is the same as an extending direction of the second edge, and an extending direction of the second sub-data line is the same as an extending direction of the third edge.

In some embodiments, an orthographic projection of the data line on the substrate does not overlap with an orthographic projection of a sub-pixel electrode corresponding to the data line on the substrate.

In some embodiments, an orthographic projection of the first sub-data line on the substrate at least partially overlaps with an orthographic projection of an adjacent sub-pixel electrode on the substrate, wherein the adjacent sub-pixel electrode is a sub-pixel electrode adjacent to the second edge of the sub-pixel electrode corresponding to the data line; and an orthographic projection of the second sub-data line on the substrate at least partially overlaps with an orthographic projection of another adjacent sub-pixel electrode on the substrate, wherein the another adjacent sub-pixel electrode is a sub-pixel electrode adjacent to the third edge of the sub-pixel electrode corresponding to the data line.

In some embodiments, the each group of the plurality of groups of sub-data lines further comprises a third connection portion connected between the first sub-data line and the second sub-data line.

In some embodiments, the display panel further comprises: a shielding layer on a side of the common electrode layer away from the substrate, wherein the shielding layer comprises a plurality of shielding units, the plurality of shielding units being arranged in one-to-one correspondence with the plurality of sub-pixel electrodes, and each shielding unit of the plurality of shielding units comprising a first portion, a second portion adjacent to the first portion, a third portion opposite to the first portion and a fourth portion opposite to the second portion.

In some embodiments, an orthographic projection of the first portion on the substrate covers an orthographic projection of the first sub-common electrode line on the substrate and an orthographic projection of a portion of an adjacent data line on the substrate, one edge of the orthographic projection of the first portion on the substrate is flush with one edge of the orthographic projection of the first sub-common electrode line on the substrate, and another edge of the orthographic projection of the first portion on the substrate is flush with one edge of the orthographic projection of the portion of the adjacent data line on the substrate, wherein the adjacent data line is a data line adjacent to a data line electrically connected to a sub-pixel electrode corresponding to the each shielding unit; or, an orthographic projection of the second portion on the substrate covers an orthographic projection of the second sub-common electrode line on the substrate and an orthographic projection of a portion of a corresponding data line on the substrate, one edge of the orthographic projection of the second portion on the substrate is flush with one edge of the orthographic projection of the second sub-common electrode line on the substrate, and another edge of the orthographic projection of the second portion on the substrate is flush with one edge of the orthographic projection of the portion of the corresponding data line on the substrate, wherein the corresponding data line is a data line electrically connected to a sub-pixel electrode corresponding to the each shielding unit; or, an orthographic projection of the third portion on the substrate covers an orthographic projection of the second sub-gate line on the substrate and an orthographic projection of another portion of a corresponding data line on the substrate, one edge of the orthographic projection of the third portion on the substrate is flush with one edge of the orthographic projection of the second sub-gate line on the substrate, and another edge of the orthographic projection of the third portion on the substrate is flush with one edge of the orthographic projection of the another portion of the corresponding data line on the substrate, wherein the corresponding data line is a data line electrically connected to a sub-pixel electrode corresponding to the each shielding unit; or, an orthographic projection of the fourth portion on the substrate covers an orthographic projection of the first sub-gate line on the substrate and an orthographic projection of another portion of an adjacent data line on the substrate, one edge of the orthographic projection of the fourth portion on the substrate is flush with one edge of the orthographic projection of the first sub-gate line on the substrate, and another edge of the orthographic projection of the fourth portion on the substrate is flush with one edge of the orthographic projection of the another portion of the adjacent data line on the substrate, wherein the adjacent data line is a data line adjacent to a data line electrically connected to a sub-pixel electrode corresponding to the each shielding unit.

In some embodiments, orthographic projections of the common electrode line, the data line and the gate line on the substrate are inside an orthographic projection of the shielding layer on the substrate, and an area of the orthographic projections of the common electrode line, the data line and the gate line on the substrate is less than an area of the orthographic projection of the shielding layer on the substrate.

In some embodiments, at least a portion of the gate line, at least a portion of the common electrode line, at least a portion of the data line and the pixel electrode layer are in a display area of the display panel; and the display panel further comprises: a first conductive layer located in a same layer as the common electrode line and located in a peripheral area, wherein the first conductive layer is connected to the common electrode line and extends along a direction from the display area to the peripheral area, and the peripheral area is on at least one side of the display area; a second conductive layer located in a same layer as the data line and located in the peripheral area, wherein the second conductive layer extends along the direction from the display area to the peripheral area; and a third conductive layer located in a same layer as the pixel electrode layer and located in the peripheral area, wherein the third conductive layer extends along the direction from the display area to the peripheral area.

In some embodiments, the first conductive layer is electrically connected to the third conductive layer through a first conductive via hole, the third conductive layer is electrically connected to the second conductive layer through a second conductive via hole, and the third conductive layer is electrically connected to the common electrode layer through a metal ball member.

According to another aspect of the present disclosure, a display device is provided. The display device comprises the display panel as described previously.

Other features and advantages of the present disclosure will become apparent from the following detailed description of exemplary embodiments of the present disclosure with reference to the accompanying drawings.

BRIEF DESCRIPTION OF THE ACCOMPANYING DRAWINGS

The accompanying drawings which constitute a part of this specification, illustrate the embodiments of the present disclosure, and together with this specification, serve to explain the principle of the present disclosure.

The present disclosure may be more explicitly understood from the following detailed description with reference to the accompanying drawings, in which.

Figure 1:
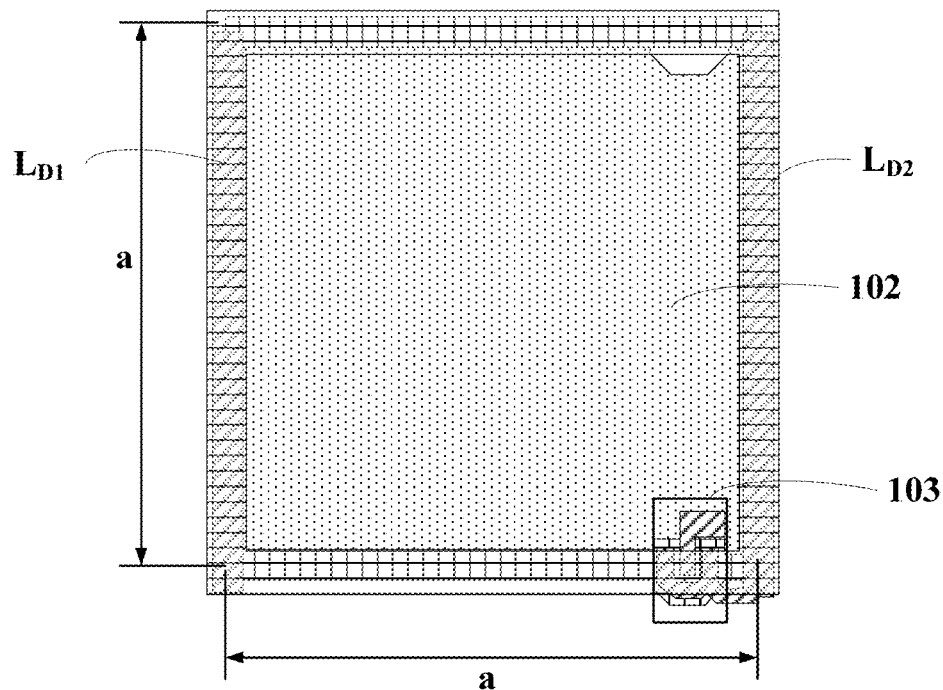
FIG. 1 is a top view schematically showing a sub-pixel of a display panel in the related art.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Figure 2:
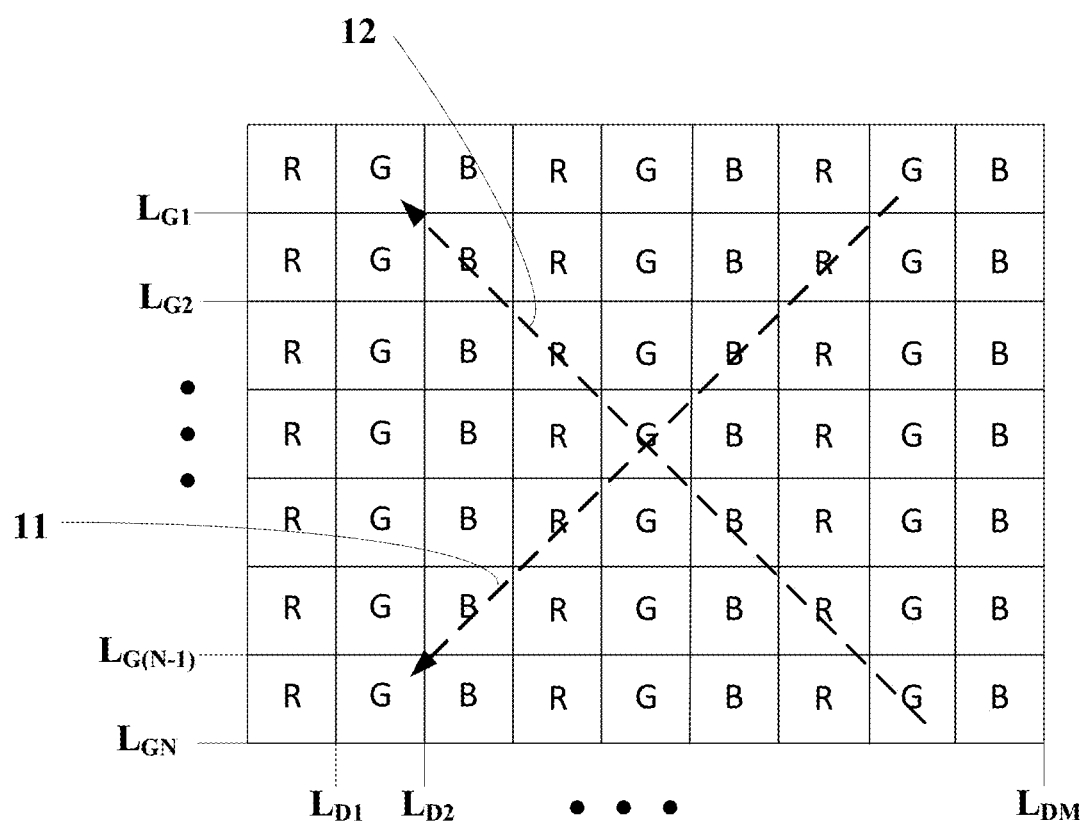
FIG. 2 is a top view schematically showing a display panel in the related art.

FIG. 1 is a top view schematically showing a sub-pixel of a display panel in the related art. FIG. 2 is a top view schematically showing a display panel in the related art.

In the related art, for a sub-pixel of a display panel (for example, a sub-pixel of the TN product), a common electrode line is formed by using a metal. As shown in FIG. 1, the sub-pixel of the display panel comprises a data line $L_{D1}$ of the sub-pixel, an adjacent data line $L_{D2}$, a sub-pixel electrode 102, and a TFT (Thin Film Transistor) 103. In addition, FIG. 1 also shows a side length a of the sub-pixel.

Take a square sub-pixel of the TN product as an example, and its pixel arrangement manner is shown in FIG. 2. FIG. 2 shows gate lines $L_{G1}$ to $L_{GN}$ and data lines $L_{D1}$ to $L_{DM}$, where N and M are positive integers. As shown in FIG. 2, rubbing directions 11 and 12 of orientation layers are 45 degrees, for example, an angle between the rubbing direction and a row direction (for example, a horizontal direction) is 45 degrees. Of these two rubbing directions 11 and 12, one is a rubbing direction of a lower orientation layer and the other is a rubbing direction of an upper orientation layer. An absorption axis of a lower polarizer is parallel or perpendicular to the rubbing direction, so that a depolarization effect of metal on light will reach a maximum. Once the alignment is slightly deviated, the light leakage at the edge of the metal line will be very apparent.

The inventors of the present disclosure have found that, a pair of orthogonal polarizers are attached to both sides of the pixel array substrate of the TN product in a manner by rotating 45 degrees so as to exclude the influence of a liquid crystal cell and a color filter (CF), so that light leakage on both sides of the metal line can be clearly seen.

Figure 3A:
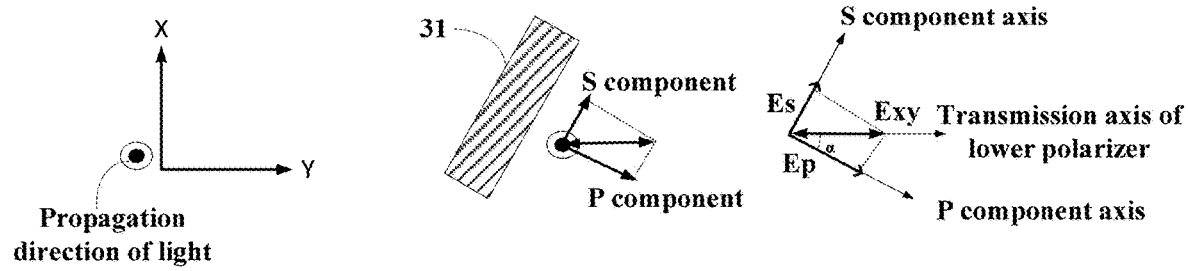
FIG. 3A is a schematic view schematically showing a principle of depolarization of polarized light in a display panel.
Figure 3B:
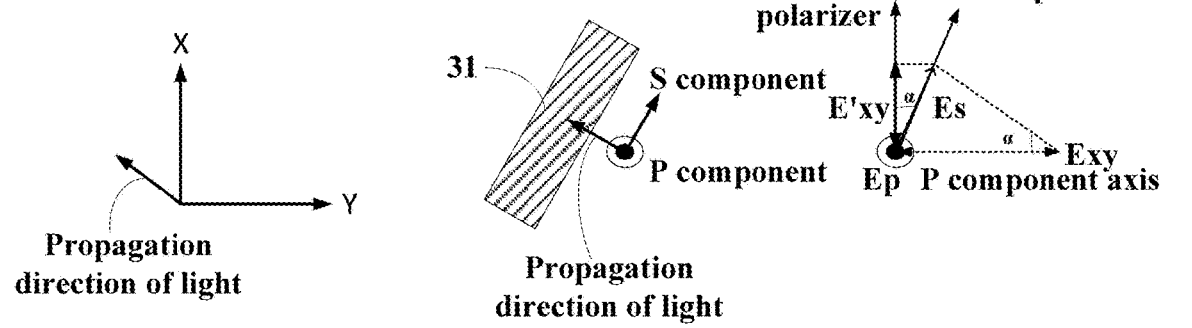
FIG. 3B is a schematic view schematically showing a principle of depolarization of polarized light in a display panel.

FIG. 3A is a schematic view schematically showing a principle of depolarization of polarized light in a display panel. FIG. 3B is a schematic view schematically showing a principle of depolarization of polarized light in a display panel. The principle of the depolarization of polarized light will be introduced below in conjunction with FIGS. 3A and 3B. A metal wire 31 is shown in FIGS. 3A and 3B. For example, the metal line 31 may be a gate line, a common electrode line, a data line or the like.

The inventors of the present disclosure have found that, a propagation direction of light changes due to diffraction when light passes through an edge of the metal line, so that when the linearly polarized light passing through the lower polarizer in an Exy direction (a transmission axis of the lower polarizer is the Exy direction) (as shown in FIG. 3A) meets the metal line, P wave becomes a vertical direction (the vertical direction is perpendicular to the plane of the display panel). As shown in FIG. 3B, the direction of P wave Ep is perpendicular to the plane of the display panel. In this way, there is only S wave Es within the plane of the display panel, and S wave Es may then be decomposed into a component E'xy in the direction of the transmission axis of the upper polarizer, that is, E'xy is the amount of depolarization. The component E'xy may be transmitted through the upper polarized light to generate light leakage. The formula is as follows:

$$E'_{xy} = E_{xy} \times \cos\alpha \times \sin\alpha = \frac{1}{2} \times E_{xy} \times \sin 2\alpha, \tag{1}$$

where α is an angle between an extending direction of the metal wire and a rubbing direction of the orientation layer (for example, the lower orientation layer).

Therefore, when α is 45°, the greater E'xy is, the worse light leakage is. When α is 0° or 90°, E'xy=0, and there is no light leakage. Therefore, under the premise of a constant viewing angle, the TN product has a great influence on light leakage of metal depolarization, which is also one of the reasons for a low contrast of the TN product.

In view of this, an embodiment of the present disclosure provides a display substrate to reduce the light leakage problem of the display panel. The display panel according to an embodiment of the present disclosure will be described in detail below in conjunction with the accompanying drawings.

Figure 4:
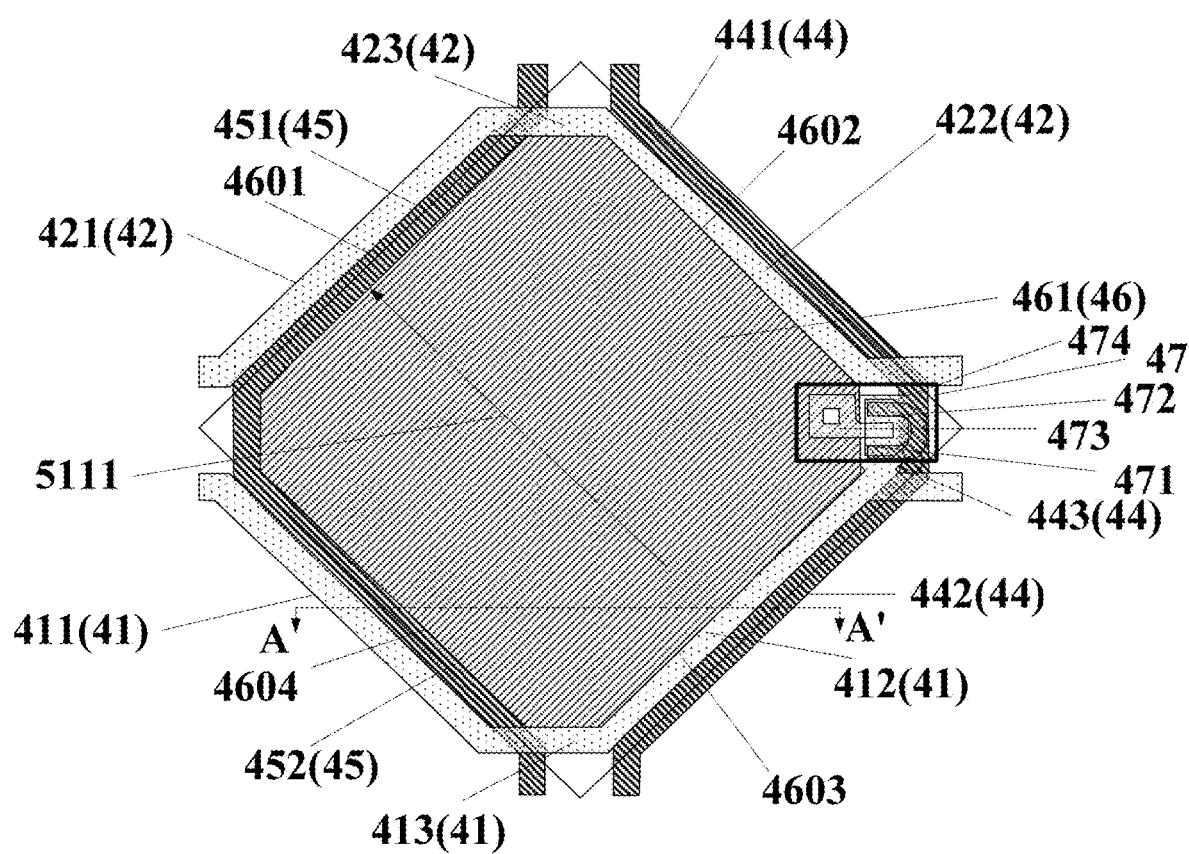
FIG. 4 is a top view schematically showing a sub-pixel of a display panel according to an embodiment of the present disclosure.
Figure 5:
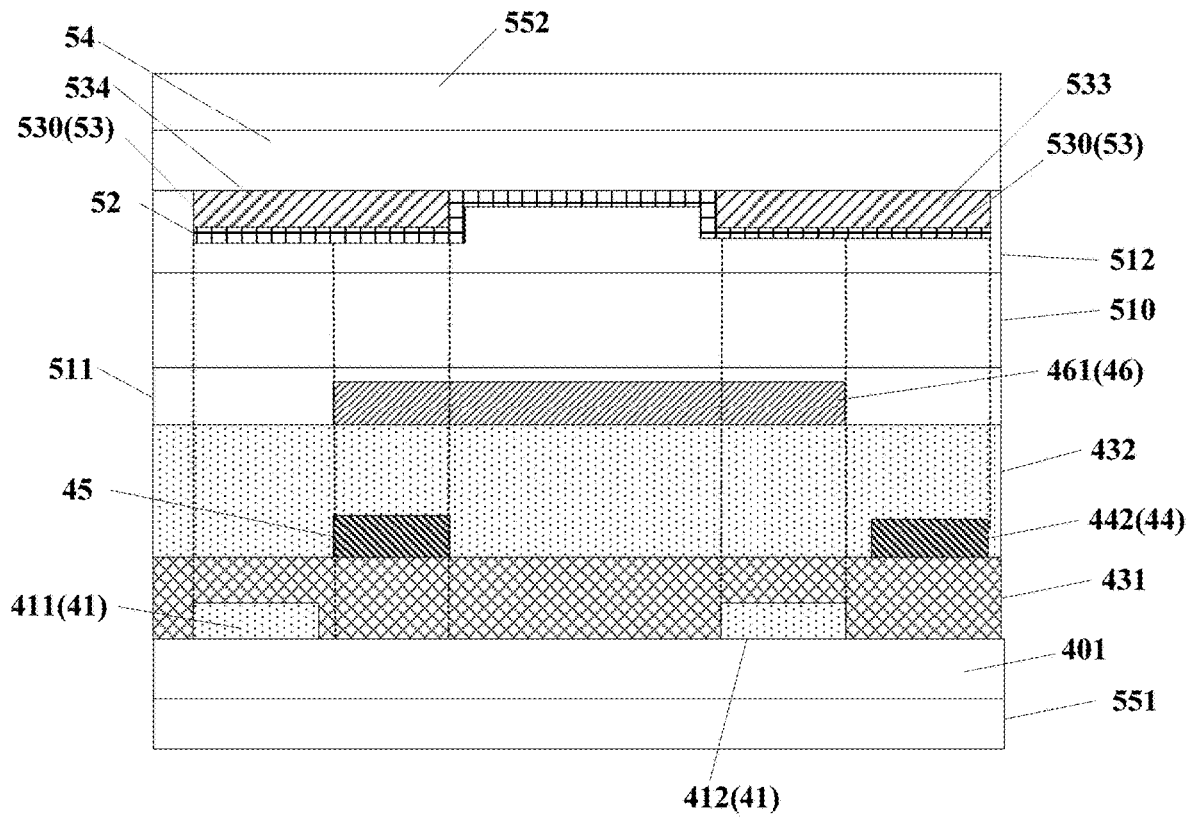
FIG. 5 is a schematic cross-sectional view schematically showing a structure of a display panel taken along line A-A' in FIG. 4 according to an embodiment of the present disclosure.
Figure 6:
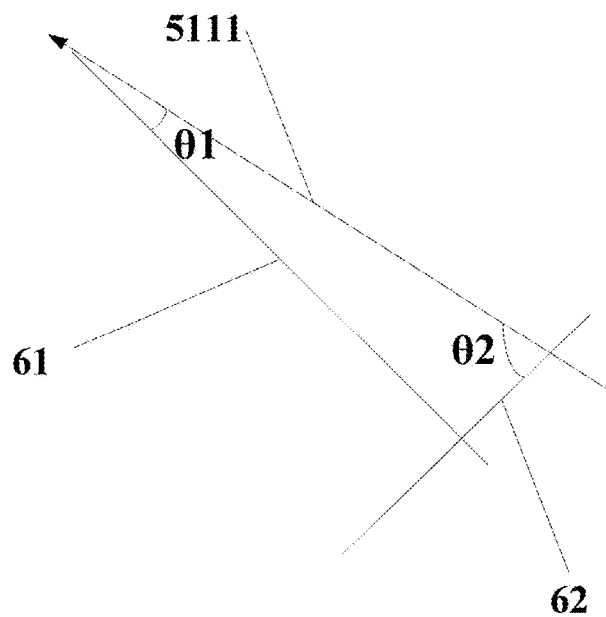
FIG. 6 is a schematic view schematically showing an angle between an extending direction of a common electrode line and a rubbing direction of a first orientation layer or an angle between an extending direction of a gate line and a rubbing direction of a first orientation layer in a display panel according to an embodiment of the present disclosure.
Figure 7:
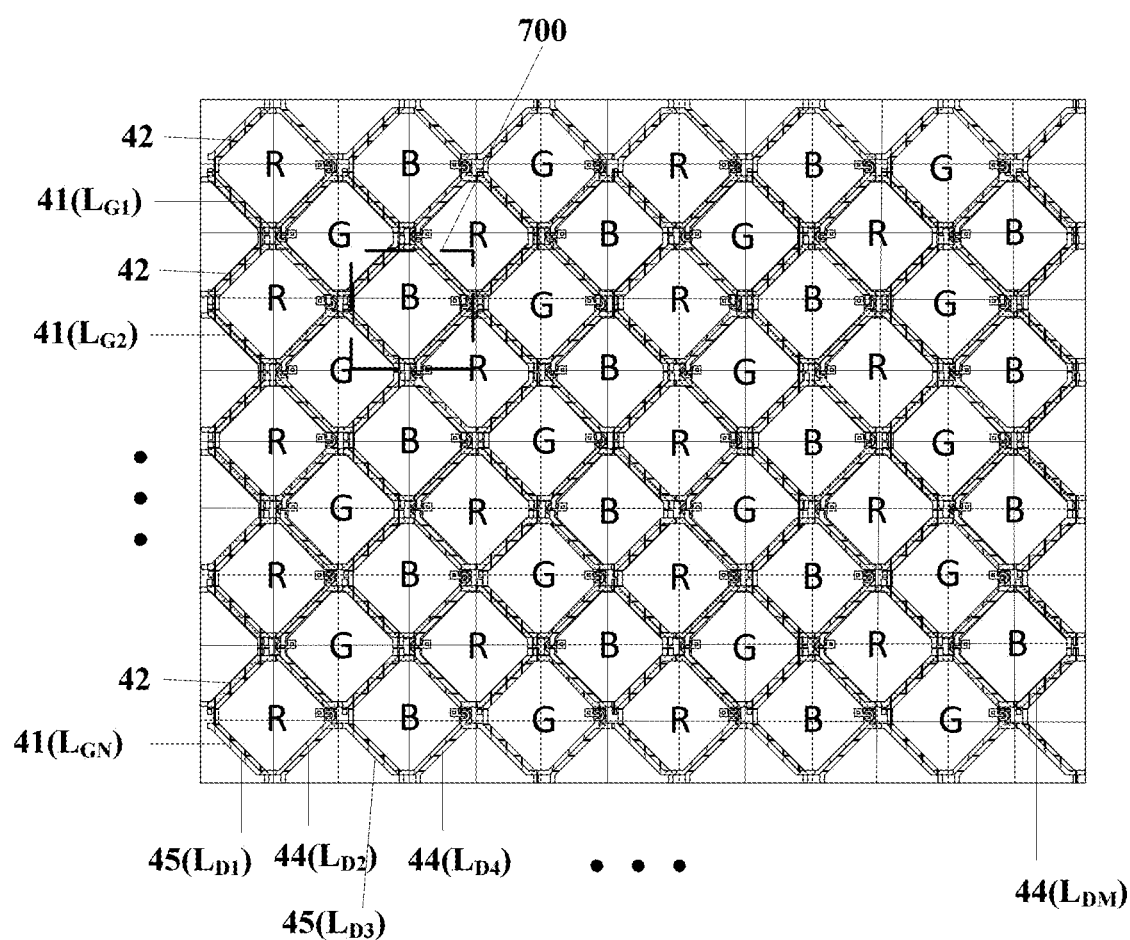
FIG. 7 is a top view schematically showing a display panel according to an embodiment of the present disclosure.

FIG. 4 is a top view schematically showing a sub-pixel of a display panel according to an embodiment of the present disclosure. FIG. 5 is a schematic cross-sectional view schematically showing a structure of a display panel taken along line A-A' in FIG. 4 according to an embodiment of the present disclosure. FIG. 6 is a schematic view schematically showing an angle between an extending direction of a common electrode line and a rubbing direction of a first orientation layer or an angle between an extending direction of a gate line and a rubbing direction of a first orientation layer in a display panel according to an embodiment of the present disclosure. FIG. 7 is a top view schematically showing a display panel according to an embodiment of the present disclosure. As shown in FIG. 7, the display panel comprises a red sub-pixel R, a green sub-pixel G, and a blue sub-pixel B. Here, a certain sub-pixel 700 is described as an example. For example, the sub-pixel 700 of the display panel shown in FIG. 7 is the sub-pixel shown in FIG. 4.

As shown in FIG. 5, the display panel comprises a substrate 401. For example, the substrate 401 is a transparent substrate such as a glass substrate.

As shown in FIGS. 4, 5 and 7, the display panel further comprises a common electrode line 42 and a gate line 41 on the substrate 401. The common electrode line 42 is isolated from the gate line 41. For example, a material of the common electrode line 42 and a material of the gate line 41 both comprise a metal such as copper. The common electrode line 42 is in a same layer as the gate line 41. The common electrode line and a pixel electrode layer (to be described later) form a capacitor, which may reduce the pull on the pixel voltage, thereby improving the display effect.

It is to be noted that, FIG. 5 is a schematic view of the structure taken along the line A-A' in FIG. 4, so that a partial structure of the gate line 41 is shown in FIG. 5. However, the common electrode line 42 is in the same layer as the gate line 41. Therefore, the common electrode line 42 is also on the substrate 401.

As shown in FIG. 7, the display panel comprises N gate lines $L_{G1}$ to $L_{GN}$, where n is a positive integer. Each of the N gate lines $L_{G1}$ to $L_{GN}$ is a gate line 41. As shown in FIG. 7, the common electrode lines 42 and the gate lines 41 are alternately arranged. In other words, there is one common electrode line between every two gate lines. The common electrode line 42 is serrated in the row direction of the display panel, and the gate line 41 is also serrated in the row direction of the display panel.

As shown in FIGS. 4 and 5, the display panel further comprises a first insulating layer 431 covering the common electrode line 42 and the gate line 41. For example, a material of the first insulating layer 431 comprises an inorganic insulating material. For example, the inorganic insulating material comprises silicon dioxide, silicon nitride, or the like. The first insulating layer 431 covers the common electrode line 42 and the gate line 41, thereby isolating the common electrode line 42 from the gate line 41.

As shown in FIGS. 4 and 5, the display panel further comprises a data line 44 on a side of the first insulating layer 431 away from the substrate. The data line 44 is a data line electrically connected to the current sub-pixel, and the data line 44 is configured to provide a data signal to the current sub-pixel.

In addition, FIGS. 4 and 5 also show a data line 45 adjacent to the data line 44, wherein the adjacent data line 45 is configured to provide a data signal to a sub-pixel in an adjacent row. In fact, the data line 44 is also a data line adjacent to another adjacent row of sub-pixels. Here, for convenient illustration and description, two data lines are labeled as 44 and 45 respectively. FIG. 7 shows that the display panel comprises M data lines $L_{D1}$ to $L_{DM}$, where M is a positive integer. The M data lines $L_{D1}$ to $L_{DM}$ may be labeled as 44 or 45.

As shown in FIG. 5, the display panel further comprises a second insulating layer 432 covering the data line 44. For example, a material of the second insulating layer 432 comprises an inorganic insulating material. For example, the inorganic insulating material comprises silicon dioxide, silicon nitride, or the like.

As shown in FIGS. 4 and 5, the display panel further comprises a pixel electrode layer 46 on a side of the second insulating layer 432 away from the substrate 401. For example, a material of the pixel electrode layer 46 comprises a transparent conductive material such as ITO (Indium Tin Oxide).

In some embodiments, as shown in FIGS. 4 and 7, the pixel electrode layer 46 comprises a plurality of sub-pixel electrodes 461 arranged in an array. That is, each sub-pixel 700 corresponds to one sub-pixel electrode 461. In some embodiments, a shape of each sub-pixel electrode 461 is a parallelogram. For example, the shape of each sub-pixel electrode 461 is a rhombus.

It is to be noted that, the shape of the sub-pixel electrode 461 described here refers to the overall approximate shape, rather than the absolute shape of the sub-pixel electrode when viewed from the angle of a top view of the display panel. For example, the parallelogram here means that the shape of the sub-pixel electrode is approximately parallelogram, or the rhombus here means that the shape of the sub-pixel electrode is approximately rhombus, and so forth.

In some embodiments, in a case where the shape of the sub-pixel electrode is square (i.e., a special rhombus), the corresponding sub-pixel is a square sub-pixel, and if a side length of the sub-pixel is a, a length of the sub-pixel in the row direction (for example, a horizontal direction) of the display panel is $\sqrt{2}a$.

As shown in FIG. 5, the display panel further comprises a first orientation layer 511 on a side of the pixel electrode layer 46 away from the substrate 401. The first orientation layer 511 covers each sub-pixel electrode 461 of the pixel electrode layer 46. A rubbing direction 5111 of the first orientation layer 511 is schematically shown in FIGS. 4 and 6.

In the embodiments of the present disclosure, an angle between an extending direction of the common electrode line 42 and a rubbing direction 5111 of the first orientation layer 511 ranges from 0 degrees to 30 degrees or from 60 degrees to 90 degrees, and an angle between an extending direction of the gate line 41 and the rubbing direction 5111 of the first orientation layer 511 ranges from 0 degrees to 30 degrees or from 60 degrees to 90 degrees. Here, since the angle between the extending direction of the common electrode line and the rubbing direction of the first orientation layer and the angle between the extending direction of the gate line and the rubbing direction of the first orientation layer are both not 45 degrees, according to the above-described formula (1), the light leakage component E'xy will be reduced, so that the light leakage problem of the display panel can be reduced, thereby improving the contrast of the display panel and further improving the display effect of the display panel.

It is to be noted that, in the embodiments of the present disclosure, when the angle between two directions is described, it refers to a minimum positive angle formed by the intersection of these two directions, that is, the angle described here refers to an angle within a range of 0 degrees to 90 degrees.

In some embodiments, the extending direction of the common electrode line 42 is substantially parallel or perpendicular to the rubbing direction 5111 of the first orientation layer, and the extending direction of the gate line 41 is substantially parallel or perpendicular to the rubbing direction 5111 of the first orientation layer. That is, the angle between the extending direction of the common electrode line 42 and the rubbing direction 5111 of the first orientation layer 511 is substantially 0 degrees or 90 degrees, and the angle between the extending direction of the gate line 41 and the rubbing direction 5111 of the first orientation layer 511 is substantially 0 degrees or 90 degrees. In this case, an angle between the extending direction of the common electrode line/the extending direction of the gate line and the row direction (for example, the horizontal direction) of the display panel is substantially 45 degrees. In the embodiment, the light leakage problem of the display panel can be further reduced, thereby improving the contrast of the display panel and further improving the display effect of the display panel.

For example, the inventors of the present disclosure have observed the display panel of the above-described embodiments of the present disclosure, and have found that the light leakage at the metal edge almost disappeared, so that the contrast of the display panel is enhanced.

It is to be noted that, the two directions described above are substantially parallel or perpendicular, which means that the two directions may be, but not limited to, absolutely parallel or perpendicular, and there may be a certain error range. For example, the error range may be an error range within 10 degrees.

As shown in FIG. 5, the display panel further comprises a liquid crystal layer 510 on a side of the first orientation layer 511 away from the substrate 401.

As shown in FIG. 5, the display panel further comprises a second orientation layer 512 on a side of the liquid crystal layer 510 away from the substrate 401. A rubbing direction of the second orientation layer 512 is perpendicular to the rubbing direction 5111 of the first orientation layer 511.

As shown in FIG. 5, the display panel further comprises a common electrode layer 52 on a side of the second orientation layer 512 away from the substrate 401. The common electrode layer 52 is electrically connected to the common electrode line 42. For example, a material of the common electrode layer 52 comprises a transparent conductive material such as ITO.

So far, a display panel according to some embodiments of the present disclosure is provided. The display panel comprises: a substrate; a common electrode line and a gate line on the substrate, wherein the common electrode line is isolated from the gate line; a first insulating layer covering the common electrode line and the gate line; a data line on a side of the first insulating layer away from the substrate; a second insulating layer covering the data line; a pixel electrode layer on a side of the second insulating layer away from the substrate; a first orientation layer on a side of the pixel electrode layer away from the substrate; a liquid crystal layer on a side of the first orientation layer away from the substrate; a second orientation layer on a side of the liquid crystal layer away from the substrate; and a common electrode layer on a side of the second orientation layer away from the substrate, wherein the common electrode layer is electrically connected to the common electrode line; wherein an angle between an extending direction of the common electrode line and a rubbing direction of the first orientation layer ranges from 0 degrees to 30 degrees or from 60 degrees to 90 degrees, and an angle between an extending direction of the gate line and the rubbing direction of the first orientation layer ranges from 0 degrees to 30 degrees or from 60 degrees to 90 degrees. Since the angle between the extending direction of the common electrode line and the rubbing direction of the first orientation layer and the angle between the extending direction of the gate line and the rubbing direction of the first orientation layer are both not 45 degrees, according to the above-described formula (1), the component E'xy of light leakage will be reduced, so that the light leakage problem of the display panel can be reduced, thereby improving the contrast of the display panel and further improving the display effect of the display panel.

In some embodiments, the common electrode line 42 comprises a plurality of groups of sub-common electrode lines, the plurality of groups of sub-common electrode lines being arranged in one-to-one correspondence with a plurality of sub-pixel electrodes in a same row. As shown in FIG. 4, each group of sub-common electrode lines comprises a first sub-common electrode line 421 and a second sub-common electrode line 422 electrically connected to the first sub-common electrode line 421. For example, as shown in FIG. 6, an angle $\theta2$ between an extending direction 62 of the first sub-common electrode line 421 and the rubbing direction 5111 of the first orientation layer ranges from 60 degrees to 90 degrees, and an angle $\theta1$ between an extending direction 61 of the second sub-common electrode line 422 and the rubbing direction 5111 of the first orientation layer ranges from 0 degrees to 30 degrees. This can reduce the light leakage problem of the display panel that might be caused by the common electrode line, thereby improving the contrast of the display panel and further improving the display effect of the display panel.

In some embodiments, the gate line 41 comprises a plurality of groups of sub-gate lines, the plurality of groups of sub-gate lines being arranged in one-to-one correspondence with a plurality of sub-pixel electrodes in a same row. As shown in FIG. 4, each group of sub-gate lines comprises a first sub-gate line 411 and a second sub-gate line 412 electrically connected to the first sub-gate line 411. For example, as shown in FIG. 6, an angle $\theta1$ between an extending direction 61 of the first sub-gate line 411 and the rubbing direction 5111 of the first orientation layer ranges from 0 degrees to 30 degrees, and an angle $\theta2$ between an extending direction 62 of the second sub-gate line 412 and the rubbing direction 5111 of the first orientation layer ranges from 60 degrees to 90 degrees. This can reduce the light leakage problem of the display panel that might be caused by the gate line, thereby improving the contrast of the display panel and further improving the display effect of the display panel.

It is to be noted that, in the previous embodiments, the shape of the sub-pixel electrode may be a parallelogram, that is, the shape of the sub-pixel is a parallelogram, so that a pattern enclosed by the first sub-common electrode line 421, the second sub-common electrode line 422, the first sub-gate line 411 and the second sub-gate line 412, which are electrically connected to the sub-pixel, is also substantially a parallelogram (for example, a rhombus). Thus, the direction 61 in FIG. 6 may represent both an extending direction of the second sub-common electrode line 422 and an extending direction of the first sub-gate line 411. Moreover, the direction 62 in FIG. 6 may represent both an extending direction of the first sub-common electrode line 421 and an extending direction of the second sub-gate line 412.

It is also to be noted that, in the embodiments of the present disclosure, when an extending direction of a certain conductive line (for example, the first sub-common electrode line 421, the second sub-common electrode line 422, the first sub-gate line 411 or the second sub-gate line 412) is described, the extending direction may be a direction extending towards two opposite directions. In this way, when an angle (for example, the angle is $\theta1$ or $\theta2$) is determined, it is convenient to obtain an angle such that the angle ranges from 0 degrees to 90 degrees.

In some embodiments, as shown in FIG. 4, each sub-pixel electrode 461 comprises a first edge 4601, a second edge 4602 adjacent to the first edge 4601, a third edge 4603 opposite to the first edge 4601, and a fourth edge 4604 opposite to the second edge 4602. The third edge 4603 is adjacent to the second edge 4602, and the fourth edge 4604 is adjacent to the first edge 4601 and the third edge 4603 respectively.

As shown in FIG. 4, the extending direction of the first sub-common electrode line 421 is the same as an extending direction of the first edge 4601 of the sub-pixel electrode, the extending direction of the second sub-common electrode line 422 is the same as an extending direction of the second edge 4602 of the sub-pixel electrode, the extending direction of the first sub-gate line 411 is the same as an extending direction of the fourth edge 4604 of the sub-pixel electrode, and the extending direction of the second sub-gate line 412 is the same as an extending direction of the third edge 4603 of the sub-pixel electrode.

In some embodiments, as shown in FIG. 5, an orthographic projection of the first sub-gate line 411 on the substrate 401 does not overlap with an orthographic projection of a sub-pixel electrode 461 corresponding to the first sub-gate line on the substrate 401; and an orthographic projection of the second sub-gate line 412 on the substrate 401 at least partially overlaps with an orthographic projection of a sub-pixel electrode 461 corresponding to the second sub-gate line on the substrate. For example, the orthographic projection of the sub-pixel electrode 461 on the substrate covers the orthographic projection of the second sub-gate line 412 on the substrate 401. This design may prevent the connection between different sub-pixel electrodes.

Similar to the first sub-gate line and the second sub-gate line, in some embodiments, an orthographic projection of the first sub-common electrode line 421 on the substrate 401 does not overlap with an orthographic projection of a sub-pixel electrode 461 corresponding to the first sub-common electrode line on the substrate 401; and an orthographic projection of the second sub-common electrode line 422 on the substrate 401 at least partially overlaps with an orthographic projection of a sub-pixel electrode 461 corresponding to the second sub-common electrode line on the substrate 401. For example, the orthographic projection of the sub-pixel electrode 461 on the substrate 401 covers the orthographic projection of the second sub-common electrode line 422 on the substrate 401. This design may prevent the connection between different sub-pixel electrodes.

In some embodiments, as shown in FIG. 4, each group of sub-common electrode lines further comprises a first connection portion 423 connected between the first sub-common electrode line 421 and the second sub-common electrode line 422. For example, the first connection portion 423 extends along a row direction of the display panel.

In some embodiments, as shown in FIG. 4, each group of sub-gate lines further comprises a second connection portion 413 connected between the first sub-gate line 411 and the second sub-gate line 412. For example, the second connection portion 413 extends along the row direction of the display panel.

In some embodiments, the data line 44 comprises a plurality of groups of sub-data lines. The plurality of groups of sub-data lines are arranged in one-to-one correspondence with a plurality of sub-pixel electrodes in a same column. Each group of sub-data lines comprises a first sub-data line 441 and a second sub-data line 442 electrically connected to the first sub-data line 441. An extending direction of the first sub-data line 441 is the same as an extending direction of the second edge 4602, and an extending direction of the second sub-data line 442 is the same as an extending direction of the third edge 4603.

Here, the extending direction of the first sub-data line is the same as the extending direction of the second edge of the sub-pixel electrode, the extending direction of the second sub-data line is the same as the extending direction of the third edge of the sub-pixel electrode, the extending direction of the second sub-common electrode line is the same as the extending direction of the second edge of the sub-pixel electrode, and the extending direction of the second sub-gate line is the same as the extending direction of the third edge of the sub-pixel electrode. Therefore, the extending direction of the first sub-data line is the same as the extending direction of the second sub-common electrode line, and the extending direction of the second sub-data line is the same as the extending direction of the second sub-gate line. Since the angle between the extending direction of the second sub-common electrode line and the rubbing direction of the first orientation layer ranges from 0 degrees to 30 degrees and the angle between the extending direction of the second sub-gate line and the rubbing direction of the first orientation layer ranges from 60 degrees to 90 degrees, an angle between the extending direction of the first sub-data line and the rubbing direction of the first orientation layer ranges from 0 degrees to 30 degrees, and an angle between the extending direction of the second sub-data line and the rubbing direction of the first orientation layer ranges from 60 degrees to 90 degrees. This design is conducive to reducing the light leakage problem of the display panel that might be caused by the data line, thereby improving the contrast of the display panel and further improving the display effect of the display panel.

In addition, similar to the data line 44, as shown in FIG. 5, the data line 45 comprises a plurality of groups of sub-data lines. Each group of sub-data lines comprises a first sub-data line 451 and a second sub-data line 452 electrically connected to the first sub-data line 451.

As shown in FIG. 5, an orthographic projection of the data line 44 on the substrate 401 does not overlap with an orthographic projection of a sub-pixel electrode 461 corresponding to the data line on the substrate 401. An orthographic projection of an adjacent data line 45 on the substrate 401 at least partially overlaps with an orthographic projection of an adjacent sub-pixel electrode 461 on the substrate 401. This design may prevent the connection between different sub-pixel electrodes.

In some embodiments, an orthographic projection of the first sub-data line 441 on the substrate 401 at least partially overlaps with an orthographic projection of an adjacent sub-pixel electrode on the substrate, wherein the adjacent sub-pixel electrode is a sub-pixel electrode adjacent to the second edge of the sub-pixel electrode corresponding to the data line. For example, the adjacent sub-pixel electrode is a sub-pixel electrode adjacent to the second edge 4602 of the sub-pixel electrode 461 shown in FIG. 4, for example, a sub-pixel electrode of a sub-pixel at the upper right of the sub-pixel 700 shown in FIG. 7 and adjacent to the sub-pixel 700.

Here, it may be seen from the data line 45 shown in FIG. 5 that the data line 45 in FIG. 5 is the second sub-data line 452. According to the periodicity of the sub-pixel array arrangement, the second sub-data line 452 of the data line 45 is equivalent to the first sub-data line 441 of the data line 44. As shown in FIG. 5, an orthographic projection of the second sub-data line 452 of the data line 45 on the substrate 401 at least partially overlaps with an orthographic projection of the current sub-pixel electrode 461 on the substrate, which indicates that an orthographic projection of the first sub-data line 441 on the substrate 401 at least partially overlaps with an orthographic projection of the adjacent sub-pixel electrode at the upper right of the current sub-pixel electrode 461 on the substrate.

For example, the orthographic projection of the adjacent sub-pixel electrode on the substrate covers the orthographic projection of the first sub-pixel data line 441 on the substrate 401. For example, the orthographic projection of the current sub-pixel electrode 461 on the substrate covers the orthographic projection of the second sub-data line 452 of the data line 45 on the substrate 401.

In other embodiments, an orthographic projection of the second sub-data line 442 on the substrate 401 at least partially overlaps with an orthographic projection of another adjacent sub-pixel electrode on the substrate, wherein the another adjacent sub-pixel electrode is a sub-pixel electrode adjacent to the third edge of the sub-pixel electrode corresponding to the data line. For example, the another adjacent sub-pixel electrode is a sub-pixel electrode adjacent to the third edge 4603 of the sub-pixel electrode 461 shown in FIG. 4, for example, the sub-pixel electrode of a sub-pixel at the lower right of the sub-pixel 700 shown in FIG. 7 and adjacent to the sub-pixel 700.

Similar as previously, in some embodiments, an orthographic projection of the another adjacent sub-pixel electrode on the substrate covers an orthographic projection of the second sub-data line 442 on the substrate 401.

As mentioned above, the above-described design of the data line may prevent the connection between different sub-pixel electrodes.

In some embodiments, as shown in FIG. 4, each group of sub-data lines further comprises a third connection portion 443 connected between the first sub-data line 441 and the second sub-data line 442. The third connection portion 443 extends along a column direction of the display panel.

In some embodiments, as shown in FIG. 4, the display panel further comprises a thin film transistor 47. For example, the thin film transistor 47 comprises a gate electrode 471, a source electrode 472, a drain electrode 473, and an active layer 474. The gate electrode 471 is electrically connected to the gate line 41, the source electrode 471 is electrically connected to the data line 44, and the drain electrode 473 is electrically connected to the sub-pixel electrode 461. Here, the gate electrode 471, the source electrode 472, the drain 473 and the active layer 474 are structures in the known art, which will not be described in detail here.

Figure 8:
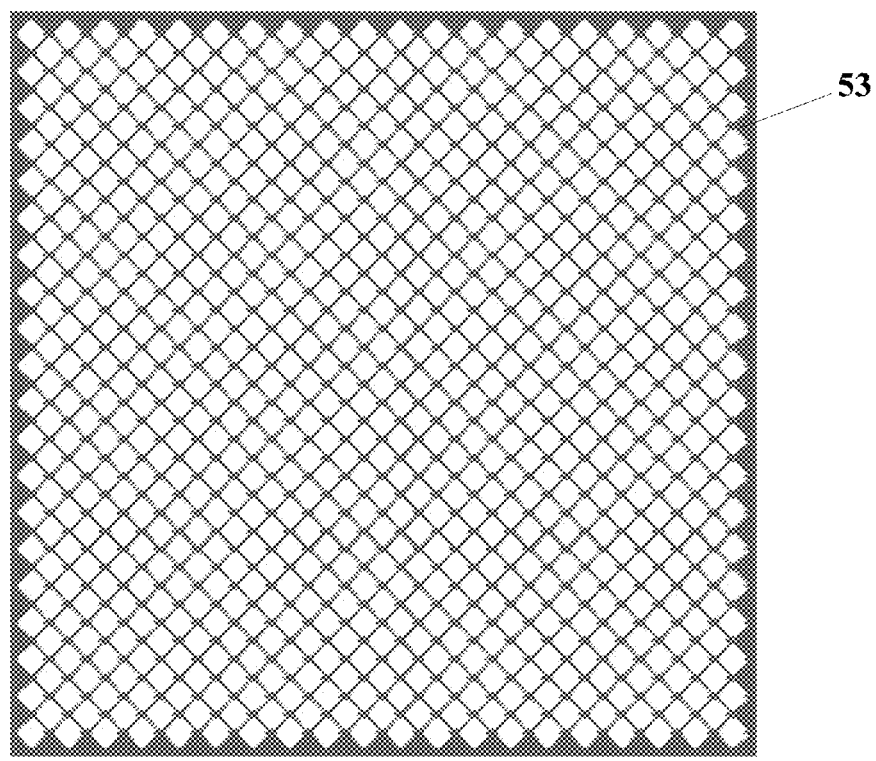
FIG. 8 is a top view schematically showing a shielding layer of a display panel according to an embodiment of the present disclosure.
Figure 9:
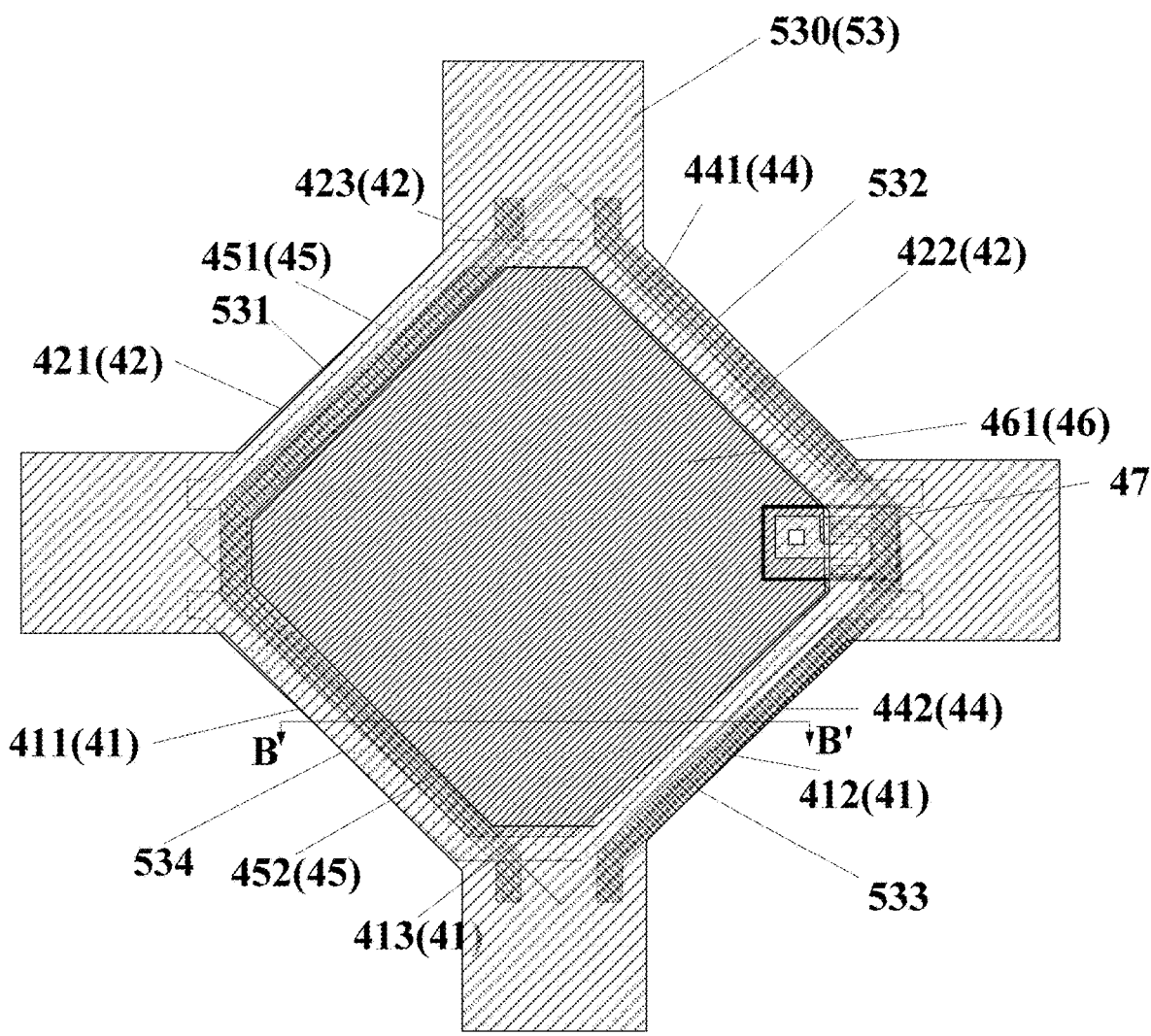
FIG. 9 is a top view schematically showing a sub-pixel of a display panel according to another embodiment of the present disclosure.

FIG. 8 is a top view schematically showing a shielding layer of a display panel according to an embodiment of the present disclosure. FIG. 9 is a top view schematically showing a sub-pixel of a display panel according to another embodiment of the present disclosure. FIG. 5 is a schematic cross-sectional view schematically showing a structure of a display panel taken along line B-B' in FIG. 9 according to an embodiment of the present disclosure.

As shown in FIGS. 5, 8 and 9, the display panel further comprises: a shielding layer 53 on a side of the common electrode layer 52 away from the substrate 401. For example, the shielding layer is a black matrix (BM). The shielding layer 53 comprises a plurality of shielding units 530. For example, FIG. 9 shows one shielding unit 530 of the shielding layer 53 shown in FIG. 8. The plurality of shielding units 530 are arranged in one-to-one correspondence with the plurality of sub-pixel electrodes. Each shielding unit 530 comprises: a first portion 531, a second portion 532 adjacent to the first portion 531, a third portion 533 opposite to the first portion 531 and a fourth portion 534 opposite to the second portion 532. The third portion 533 is adjacent to the second portion 532 and the fourth portion 534 respectively, and the fourth portion 534 is adjacent to the first portion 531.

In some embodiments, as shown in FIG. 9, an orthographic projection of the first portion 531 on the substrate 401 covers an orthographic projection of the first sub-common electrode line 421 on the substrate and an orthographic projection of a portion of an adjacent data line 45 (for example, the first sub-data line 451 of the adjacent data line 45) on the substrate, one edge of the orthographic projection of the first portion 531 on the substrate 401 is flush with one edge of the orthographic projection of the first sub-common electrode line 421 on the substrate 401, and another edge of the orthographic projection of the first portion 531 on the substrate 401 is flush with one edge of the orthographic projection of the portion of the adjacent data line 45 (for example, the first sub-data line 451 of the adjacent data line 45) on the substrate 401, wherein the adjacent data line is a data line 45 adjacent to a data line 44 electrically connected to a sub-pixel electrode corresponding to the each shielding unit. Compared with a shielding layer in the related art, the first portion of the shielding layer in the embodiment of the present disclosure has a smaller width, which can reduce the light shielding of the shielding layer, thereby enlarging an aperture ratio of the display panel and improving the display effect of the display panel.

In some embodiments, as shown in FIG. 9, an orthographic projection of the second portion 532 on the substrate 401 covers an orthographic projection of the second sub-common electrode line 422 on the substrate 401 and an orthographic projection of a portion of a corresponding data line 44 (for example, the first sub-data line 441 of the data line 44) on the substrate 401, one edge of the orthographic projection of the second portion 532 on the substrate 401 is flush with one edge of the orthographic projection of the second sub-common electrode line 422 on the substrate 401, and another edge of the orthographic projection of the second portion 532 on the substrate 401 is flush with one edge of the orthographic projection of the portion of the corresponding data line 44 (for example, the first sub-data line 441 of the data line 44) on the substrate 401, wherein the corresponding data line is a data line 44 electrically connected to a sub-pixel electrode 461 corresponding to the each shielding unit. Compared with the shielding layer in the related art, the second portion of the shielding layer in the embodiment of the present disclosure has a smaller width, which may reduce the light shielding of the shielding layer, thereby enlarging the aperture ratio of the display panel and improving the display effect of the display panel.

In some embodiments, as shown in FIGS. 5 and 9, an orthographic projection of the third portion 533 on the substrate 401 covers an orthographic projection of the second sub-gate line 412 on the substrate and an orthographic projection of another portion of a corresponding data line 44 (for example, the second sub-data line 442 of the data line 44) on the substrate, one edge of the orthographic projection of the third portion 533 on the substrate 401 is flush with one edge of the orthographic projection of the second sub-gate line 412 on the substrate 401, and another edge of the orthographic projection of the third portion 533 on the substrate 401 is flush with one edge of the orthographic projection of the another portion of the corresponding data line 44 (for example, the second sub-data line 442 of the data line 44) on the substrate 401, wherein the corresponding data line is a data line 44 electrically connected to a sub-pixel electrode 461 corresponding to the each shielding unit. Compared with the shielding layer in the related art, the third portion of the shielding layer in the embodiment of the present disclosure has a smaller width, which may reduce the light shielding of the shielding layer, thereby enlarging the aperture ratio of the display panel and improving the display effect of the display panel.

In some embodiments, as shown in FIGS. 5 and 9, an orthographic projection of the fourth portion 534 on the substrate 401 covers an orthographic projection of the first sub-gate line 411 on the substrate 401 and an orthographic projection of another portion of an adjacent data line 45 (for example, the second sub-data line 452 of the adjacent data line 45) on the substrate 401, one edge of the orthographic projection of the fourth portion 534 on the substrate 401 is flush with one edge of the orthographic projection of the first sub-gate line 411 on the substrate 401, and another edge of the orthographic projection of the fourth portion 534 on the substrate 401 is flush with one edge of the orthographic projection of the another portion of the adjacent data line 45 (for example, the second sub-data line 452 of the adjacent data line 45) on the substrate 401, wherein the adjacent data line is a data line 45 adjacent to a data line 44 electrically connected to a sub-pixel electrode 461 corresponding to the each shielding unit. Compared with the shielding layer in the related art, the fourth portion of the shielding layer in the embodiment of the present disclosure has a smaller width, which may reduce the light shielding of the shielding layer, thereby enlarging the aperture ratio of the display panel and improving the display effect of the display panel. In the above-described embodiments, each shielding unit of the shielding layer comprises the first portion, the second portion, the third portion and the fourth portion. For example, a shape of the shielding unit is approximately a rhombus.

In other embodiments, orthographic projections of the common electrode line, the data line and the gate line on the substrate are inside an orthographic projection of the shielding layer on the substrate. An area of the orthographic projections of the common electrode line, the data line and the gate line on the substrate is less than an area of the orthographic projection of the shielding layer on the substrate. This may further improve the light shielding effect of the shielding layer and reduce the light leakage caused by the metal wire.

For example, orthographic projections of the first sub-common electrode line and a portion of the adjacent data line on the substrate are inside the orthographic projection of the first portion of the each shielding unit on the substrate. An area of the orthographic projections of the first sub-common electrode line and the portion of the adjacent data line on the substrate is less than an area of the orthographic projection of the first portion of the each shielding unit on the substrate.

For another example, orthographic projections of the second sub-common electrode line and a portion of the corresponding data line on the substrate are inside the orthographic projection of the second portion on the substrate. An area of the orthographic projections of the second sub-common electrode line and the portion of the corresponding data line on the substrate is less than an area of the orthographic projection of the second portion on the substrate.

For another example, orthographic projections of the second sub-gate line and another portion of the corresponding data line on the substrate are inside the orthographic projection of the third portion on the substrate. An area of the orthographic projections of the second sub-gate line and the another portion of the corresponding data line on the substrate is less than an area of the orthographic projection of the third portion on the substrate.

For another example, orthographic projections of the first sub-gate line and another portion of the adjacent data line on the substrate are inside the orthographic projection of the fourth portion on the substrate. An area of the orthographic projections of the first sub-gate line and the another portion of the adjacent data line on the substrate is less than an area of the orthographic projection of the fourth portion on the substrate.

Figure 10:
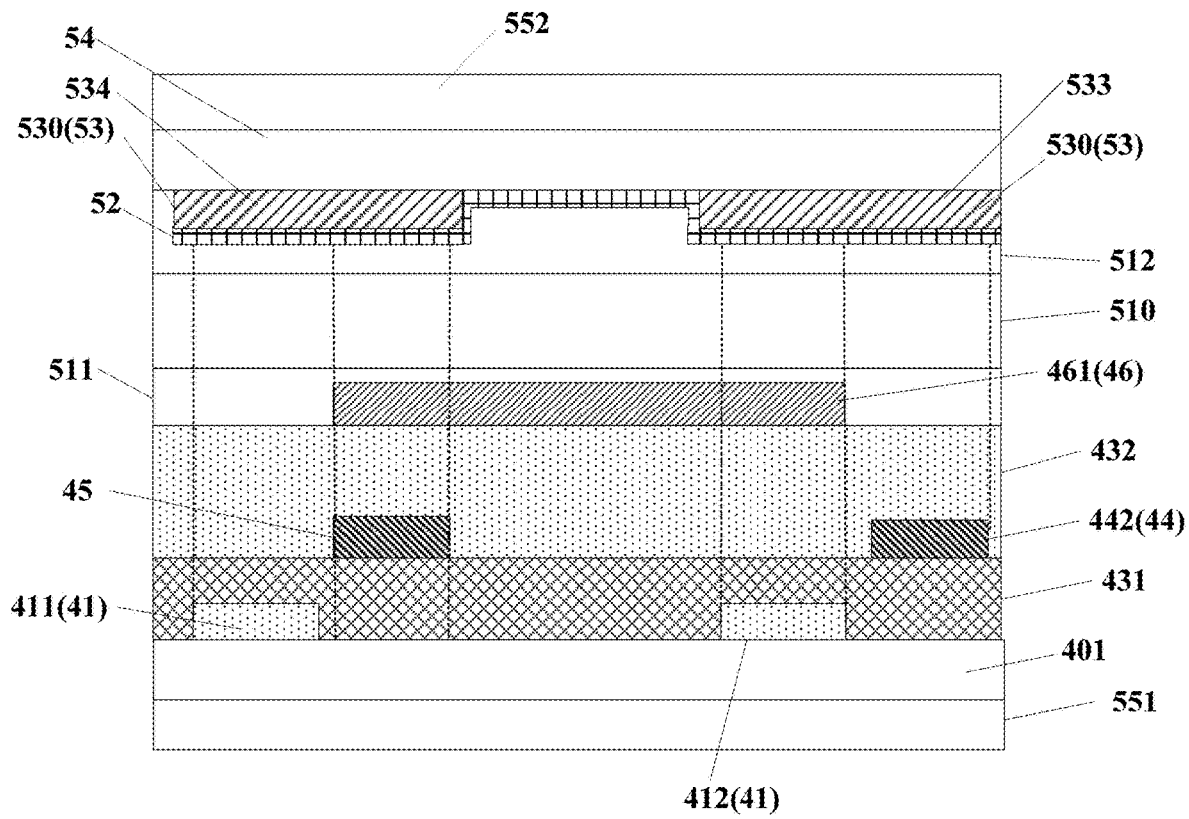
FIG. 10 is a schematic cross-sectional view schematically showing a display panel according to another embodiment of the present disclosure.

For example, FIG. 10 is a schematic cross-sectional view schematically showing a display panel according to another embodiment of the present disclosure.

As shown in FIG. 10, the orthographic projections of the second sub-gate line 412 and another portion of the corresponding data line 44 on the substrate 401 are inside the orthographic projection of the third portion 533 of the shielding unit 530 on the substrate 401. An area of orthographic projections of the second sub-gate line 412 and the another portion of the corresponding data line 44 on the substrate 401 is less than an area of the orthographic projection of the third portion 533 of the shielding unit 530 on the substrate 401. This may further improve the light shielding effect of the shielding layer and reduce the light leakage caused by the metal wire.

As shown in FIG. 10, the orthographic projections of the first sub-gate line 411 and another portion of the adjacent data line 45 on the substrate 401 are inside the orthographic projection of the fourth portion 534 of the shielding unit 530 on the substrate 401. An area of orthographic projection of the first sub-gate line 411 and the another portion of the adjacent data line 45 on the substrate 401 is less than an area of the orthographic projection of the fourth portion 534 on the substrate 401. This may further improve the light shielding effect of the shielding layer and reduce the light leakage caused by the metal wire.

It is to be noted that, FIG. 10 depicts the cross-sectional conditions of the third portion 533 and the fourth portion 534 of the shielding unit 530, and the cross-sectional conditions of the first portion 531 and the second portion 532 of the shielding unit 530 are similar and will not be shown here, and reference may be made to the above description.

In some embodiments, the peripheral portion of the display panel may use a rhombus shielding solution, as shown in FIG. 8. Such solution may allow the display panel to have a red sub-pixel, a green sub-pixel and a blue sub-pixel with the same aperture ratio so as to reduce the risk of an edge color line, thereby reducing the sawtooth feeling when the user watches the panel and further improving the display effect of the display panel.

In some embodiments, as shown in FIG. 5, the display panel further comprises a color filter 54 on a side of the shielding layer 53 away from the substrate 401.

In some embodiments, as shown in FIG. 5, the display panel further comprises a first polarizer (which may also be referred to as a lower polarizer) 551. The first polarizer 551 is on a side of the substrate 401 away from the gate line 41. A direction of a transmission axis of the first polarizer 551 is parallel to the rubbing direction of the first orientation layer 511.

Since the angle between the extending direction of the common electrode line and the rubbing direction of the first orientation layer ranges from 0 degrees to 30 degrees or from 60 degrees to 90 degrees, and the angle between the extending direction of the gate line and the rubbing direction of the first orientation layer ranges from 0 degrees to 30 degrees or from 60 degrees to 90 degrees, the angle between the extending direction of the common electrode line and a direction of a transmission axis of the first polarizer 551 ranges from 0 degrees to 30 degrees or from 60 degrees to 90 degrees, and the angle between the extending direction of the gate line and the direction of the transmission axis of the first polarizer 551 ranges from 0 degrees to 30 degrees or from 60 degrees to 90 degrees. This may reduce the light leakage problem of the display panel, thereby improving the contrast of the display panel and further improving the display effect of the display panel.

For example, the angle between the extending direction of the common electrode line 42 and the direction of the transmission axis of the first polarizer 551 is substantially 0 degrees or 90 degrees, and the angle between the extending direction of the gate line 41 and the direction of the transmission axis of the first polarizer 551 is substantially 0 degrees or 90 degrees. This may further reduce the light leakage problem of the display panel, thereby improving the contrast of the display panel and further improving the display effect of the display panel.

In some embodiments, as shown in FIG. 5, the display panel further comprises a second polarizer (which may also be referred to as an upper polarizer) 552. The second polarizer 552 is on a side of the color filter 54 away from the shielding layer 53. A direction of a transmission axis of the second polarizer 552 is perpendicular to the direction of the transmission axis of the first polarizer 551. The direction of the transmission axis of the second polarizer 552 is parallel to the rubbing direction of the second orientation layer 512.

Figure 11:
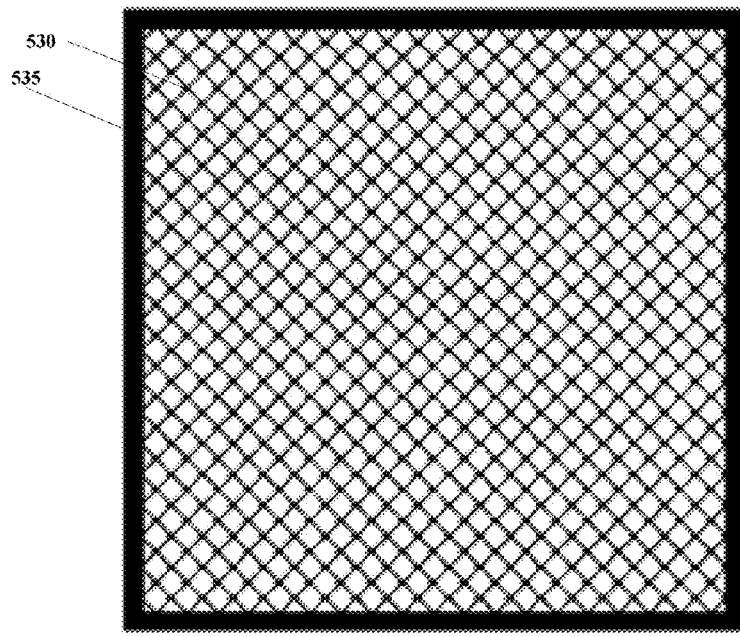
FIG. 11 is a top view schematically showing a shielding layer of a display panel according to another embodiment of the present disclosure.

FIG. 11 is a top view schematically showing a shielding layer of a display panel according to another embodiment of the present disclosure. As may be seen from FIG. 11, an edge portion 535 of the shielding layer in the embodiment has a straight-side shape. Due to the shielding effect of the shielding layer, the straight-side shaped edge portion of the shielding layer might make a shape of a sub-pixel at the edge portion of the display panel be a triangle.

However, in the shielding layer shown in FIG. 8, the edge portion of the shielding layer uses a rhombus shielding solution. By this solution, the sub-pixel at the edge portion of the display panel may remain in a quadrangular shape without being shielded, so that the display panel has a red sub-pixel, a green sub-pixel and a blue sub-pixel with the same aperture ratio so as to reduce the risk of an edge color line, thereby reducing the sawtooth feeling when the user watches the panel and further improving the display effect of the display panel.

Figure 12:
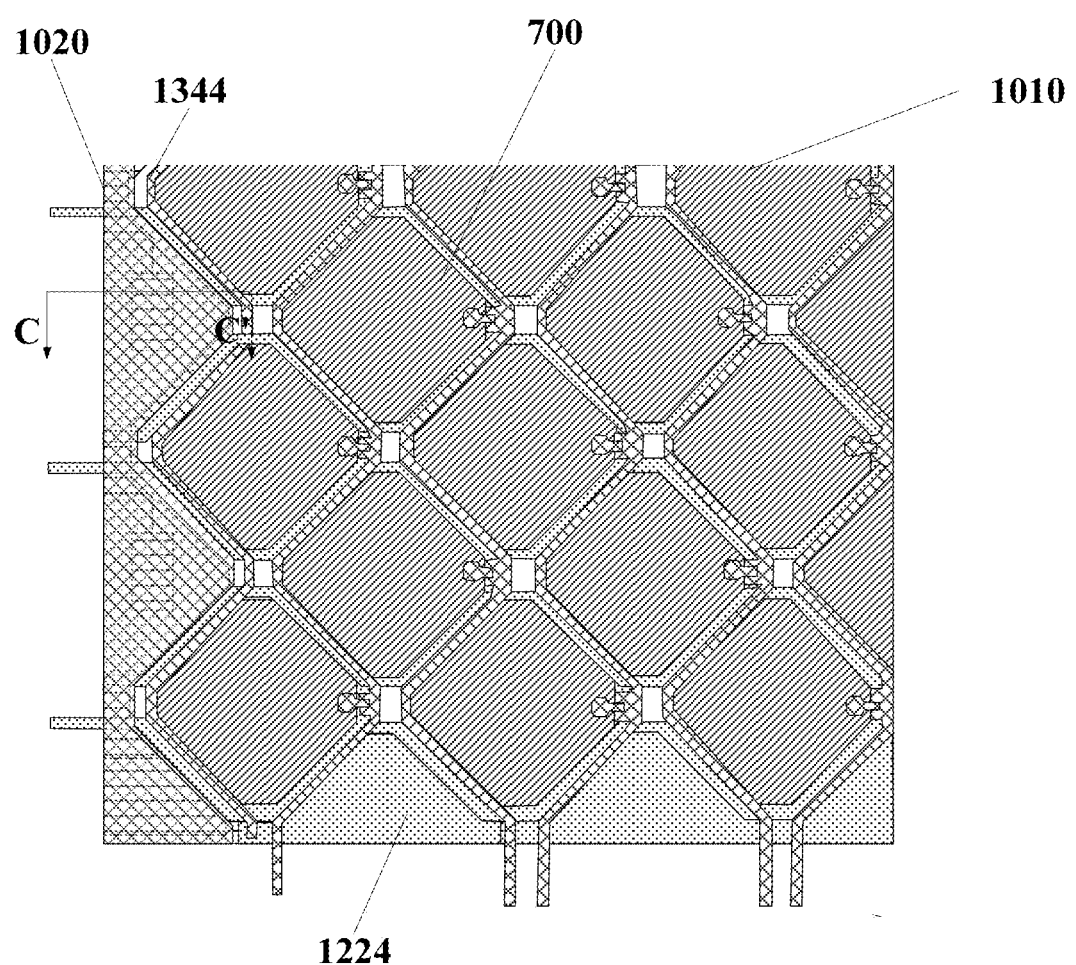
FIG. 12 is a top view schematically showing a portion of a peripheral area and a portion of a display area of a display panel according to an embodiment of the present disclosure.

FIG. 12 is a top view schematically showing a portion of a peripheral area and a portion of a display area of a display panel according to an embodiment of the present disclosure.

As shown in FIG. 12, the display panel comprises a display area 1010 and a peripheral area 1020 on at least one side of the display area. For example, the peripheral area 1020 surrounds the display area 1010.

In some embodiments, at least a portion of the gate line 41, at least a portion of the common electrode line 42, at least a portion of the data line 44 (or 45) and the pixel electrode layer 46 are in the display area 1010 of the display panel.

Figure 13:
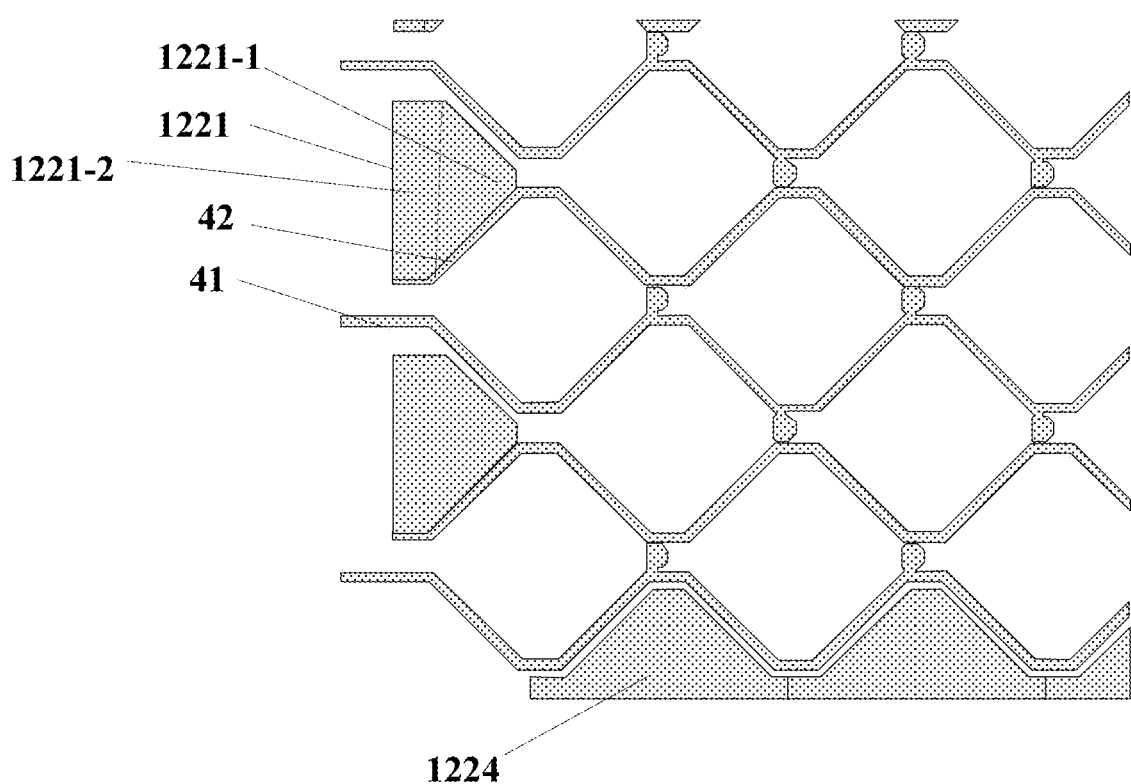
FIG. 13 is a layout view schematically showing a common electrode line, a gate line and a first conductive layer of a display panel according to an embodiment of the present disclosure.
Figure 14:
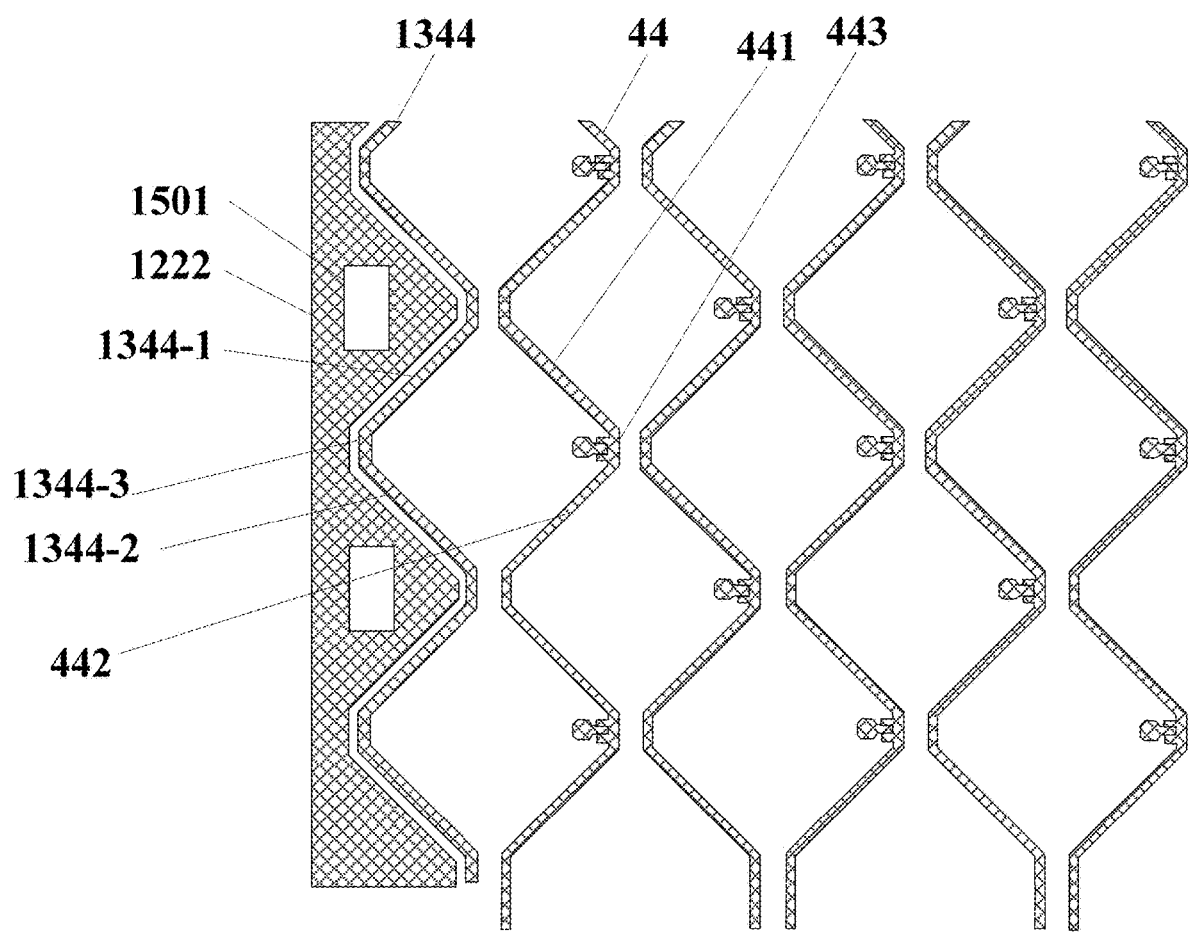
FIG. 14 is a layout view schematically showing a data line and a second conductive layer of a display panel according to another embodiment of the present disclosure.
Figure 15:
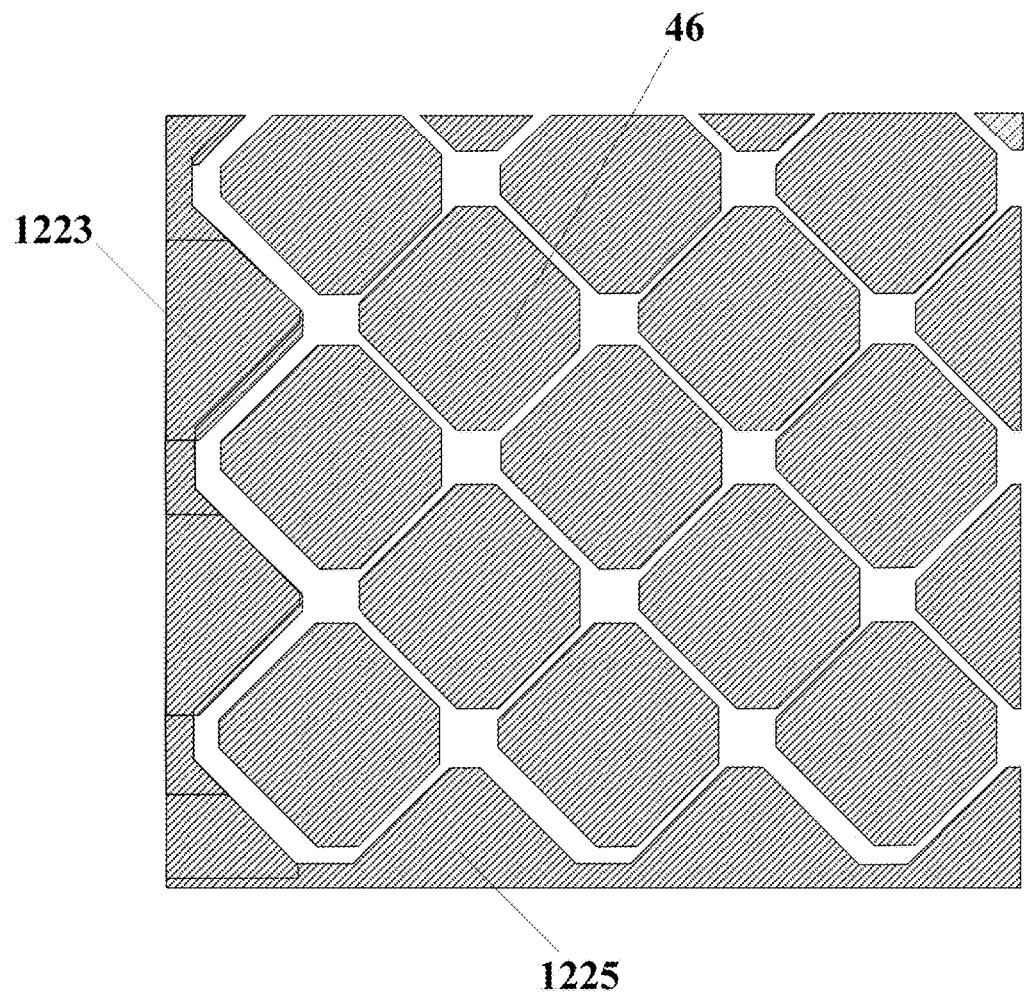
FIG. 15 is a layout view schematically showing a pixel electrode layer and a third conductive layer of a display panel according to another embodiment of the present disclosure.

FIG. 13 is a layout view schematically showing a common electrode line, a gate line and a first conductive layer of a display panel according to an embodiment of the present disclosure. FIG. 14 is a layout view schematically showing a data line and a second conductive layer of a display panel according to another embodiment of the present disclosure. FIG. 15 is a layout view schematically showing a pixel electrode layer and a third conductive layer of a display panel according to another embodiment of the present disclosure.

In some embodiments, as shown in FIG. 13, the display panel further comprises: a first conductive layer 1221 located in a same layer as the common electrode line 42 and located in the peripheral area 1020. The first conductive layer 1221 is connected to the common electrode line 42 and extends along a direction from the display area to the peripheral area. Here, as mentioned above, the peripheral area is on at least one side of the display area.

For example, as shown in FIG. 13, the first conductive layer 1221 comprises a first sub-conductive layer 1221-1 and a second sub-conductive layer 1221-2. The first sub-conductive layer 1221-1 is connected to the common electrode line 42, and a shape of the first sub-conductive layer 1221-1 is adapted to the common electrode line 42 (for example, the first sub-common electrode line 421) and the gate line 41. For example, the shape of the first sub-conductive layer 1221-1 is generally triangular. The second sub-conductive layer 1221-2 is connected to the first sub-conductive layer 1221-1, and connected to the first connection portion of the common electrode line 42. A shape of The second sub-conductive layer 1221-2 is generally rectangular.

In some embodiments, as shown in FIG. 13, the display panel further comprises a fourth conductive layer 1224 in a same layer as the common electrode line 42. The fourth conductive layer is located in the peripheral area, and located on a side of the gate line away from the display area 1010. For example, as shown in FIG. 13, the fourth conductive layer 1224 is isolated from the gate line 41. A shape of the fourth conductive layer 1224 is adapted to the extending direction of the gate line. For example, the fourth conductive layer 1224 is generally shaped as a plurality of triangles which are continuous. The fourth conductive layer may also be electrically connected to the common electrode layer 52 through a via hole in the upper film layer thereof (i.e., a via hole in the film layer on a side away from the substrate 401). This may reduce the resistance of electrical connection between the common electrode line and the common electrode layer, and provide uniformity of the display panel.

For example, materials of the first conductive layer 1221 and the fourth conductive layer 1224 are the same as the material of the common electrode line. For example, the material of the first conductive layer 1221 comprises a metal such as copper. For example, the first conductive layer 1221, the common electrode line 42 and the gate line 41 are formed by a same patterning process.

In some embodiments, as shown in FIG. 14, the display panel further comprises: a second conductive layer 1222 located in a same layer as the data line 44 and located in the peripheral area. The second conductive layer 1222 extends along the direction from the display area to the peripheral area. For example, the material of the second conductive layer 1222 is the same as the material of the data line. For example, the material of the second conductive layer 1222 comprises a metal such as copper. For example, the second conductive layer 1222 and the data line are formed by a same patterning process.

In some embodiments, as shown in FIG. 14, the display panel further comprises: a dummy data line 1344 between the second conductive layer 1222 and the data line 44. The dummy data line is not electrically connected to the sub-pixel, so the dummy data line does not provide a data signal to the sub-pixel. For example, as shown in FIG. 14, one end (for example, a lower end and an upper end) of the dummy data line 1344 is isolated from another structure. For example, an orthographic projection of one end (for example, a lower end and an upper end) of the dummy data line 1344 on the display panel falls within an orthographic projection of the fourth conductive layer 1224 on the display panel. Here, the data lines 44 (and 45) are electrically connected to other structural layers. A length of the dummy data line 1344 is less than lengths of the data lines 44 (and 45). A column of sub-pixels are provided between the dummy data line and a data line adjacent to the dummy data line, and the column of sub-pixels are electrically connected to the data line. In the embodiment, the dummy data line is provided so that the display uniformity of the entire panel can be improved.

As shown in FIG. 14, the dummy data line 1344 comprises a first sub-dummy data line 1344-1 and a second sub-dummy data line 1344-2. An extending direction of the first sub-dummy data line 1344-1 is parallel to an extending direction of the second sub-data line 442 of the data line 44. An extending direction of the second sub-dummy data line 1344-2 is parallel to an extending direction of the first sub-data line 441 of the data line 44. The first sub-dummy data line 1344-1, the second sub-dummy data line 1344-2, the first sub-data line 441 and the second sub-data line 442 generally surround a sub-pixel and extend along the edge of the sub-pixel respectively. The dummy data line 1344 further comprises a dummy connection portion 1344-3 between the first sub-dummy data line 1344-1 and the second sub-dummy data line 1344-2. The dummy connection portion 1344-3 is connected to the first sub-dummy data line 1344-1 and the second sub-dummy data line 1344-2.

A shape of the second conductive layer 1222 is adapted to the dummy data line 1344, and the second conductive layer 1222 is isolated from the dummy data line 1344. The second conductive layer 1222 is generally shaped as a plurality of triangles which are continuous. This may improve the uniformity of the display panel and the utilization rate of the panel space.

In some embodiments, as shown in FIG. 15, the display panel further comprises: a third conductive layer 1223 located in a same layer as the pixel electrode layer 46 and located in the peripheral area. The third conductive layer 1223 extends along the direction from the display area to the peripheral area. For example, a material of the third conductive layer 1223 is the same as the material of the pixel electrode layer 46. For example, the material of the third conductive layer 1223 comprises a transparent conductive material such as ITO. For example, the third conductive layer 1223 and the pixel electrode layer are formed by a same patterning process. The third conductive layer 1223 is isolated from the pixel electrode. The shape of the third conductive layer 1223 is adapted to the shape of the sub-pixel electrode.

In other embodiments, the display panel further comprises: a fifth conductive layer 1225 located in a same layer as the pixel electrode layer 46 and located in the peripheral area. The fifth conductive layer 1225 and the third conductive layer 1223 are in different peripheral areas. The fifth conductive layer 1225 is isolated from the pixel electrode layer. A shape of the fifth conductive layer 1225 is adapted to a shape of the sub-pixel electrode.

In the embodiments of the present disclosure, the first conductive layer, the second conductive layer and the third conductive layer extend along the direction from the display area to the peripheral area respectively. The design of the peripheral area may ensure a punching area between different layers and make full use of the space of the display panel.

Figure 16:
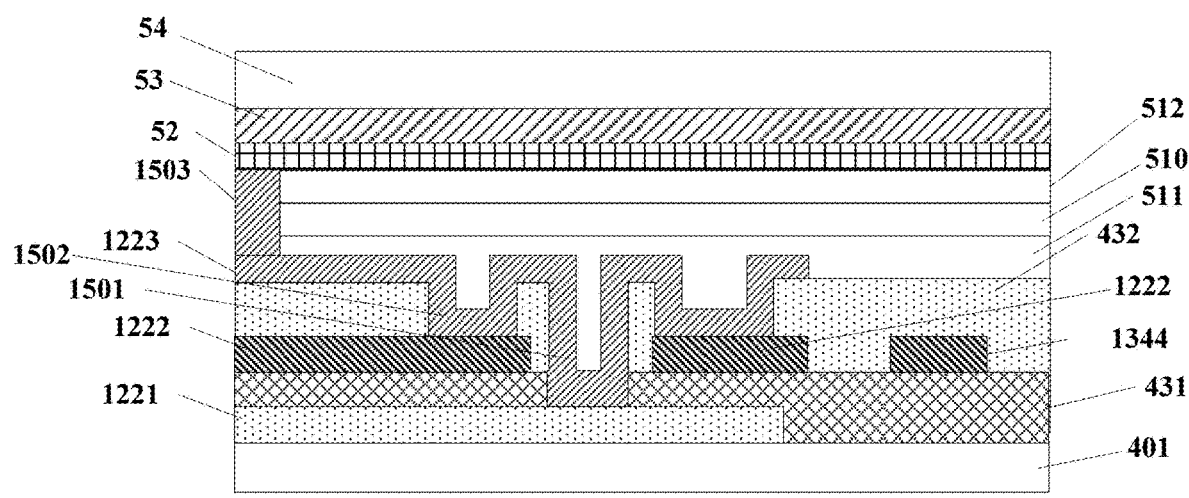
FIG. 16 is a schematic cross-sectional view schematically showing a structure of a display panel taken along line C-C' in FIG. 12 according to an embodiment of the present disclosure.

FIG. 16 is a schematic cross-sectional view schematically showing a structure of a display panel taken along line C-C' in FIG. 12 according to an embodiment of the present disclosure.

As shown in FIG. 16, the first conductive layer 1221 is electrically connected to the third conductive layer 1223 through a first conductive via hole 1501. The first conductive via hole 1501 passes through the first insulating layer 431 and the second insulating layer 432. The third conductive layer 1223 is electrically connected to the second conductive layer 1222 through a second conductive via hole 1502. Here, the second conductive via hole 1502 passes through the second insulating layer 432. The third conductive layer 1223 is electrically connected to the common electrode layer 52 through a metal ball member 1503. The periphery of the display panel is encapsulated with a frame sealant. Since the first conductive layer 1221 is also connected to the common electrode line, the embodiment achieves the electrical connection between the common electrode line and the common electrode layer. In this way, a common voltage signal may be provided to the common electrode layer through the common electrode line.

In addition, in the above-described embodiments, since the third conductive layer 1223 is electrically connected to the second conductive layer 1222 through the second conductive via hole 1502, it is possible to reduce the resistance of the electrical connection between the common electrode line and the common electrode layer, thereby improving the performance of the display panel.

It is to be noted that, the portion shown in FIG. 16 is a structure taken along the line C-C' in FIG. 12, and fewer via holes are drawn at C-C' in FIG. 12 for convenient illustration. Actually, there are many via holes at C-C' in FIG. 12.

In some embodiments of the present disclosure, a display device is provided. The display device comprises the display panel as described previously. For example, the display device may be any product or member having a display function, such as a mobile phone, a tablet computer, a television, a display, a notebook computer, a digital photo frame, a navigator, or the like.

Hereto, various embodiments of the present disclosure have been described in detail. Some details well known in the art are not described in order to avoid obscuring the concept of the present disclosure. According to the above description, those skilled in the art would fully understand how to implement the technical solutions disclosed here.

Although some specific embodiments of the present disclosure have been described in detail by way of examples, those skilled in the art should understand that the above examples are only for the purpose of illustration but not for limiting the scope of the present disclosure. It should be understood by those skilled in the art that modifications to the above embodiments or equivalently substitution of portion of the technical features may be made without departing from the scope and spirit of the present disclosure. The scope of the present disclosure is defined by the appended claims.

What is claimed is:

1. A display panel, comprising:
a substrate;
a common electrode line and a gate line on the substrate, wherein the common electrode line is isolated from the gate line;
a first insulating layer covering the common electrode line and the gate line;
a data line on a side of the first insulating layer away from the substrate;
a second insulating layer covering the data line;
a pixel electrode layer on a side of the second insulating layer away from the substrate;
a first orientation layer on a side of the pixel electrode layer away from the substrate;
a liquid crystal layer on a side of the first orientation layer away from the substrate;
a second orientation layer on a side of the liquid crystal layer away from the substrate; and
a common electrode layer on a side of the second orientation layer away from the substrate, wherein the common electrode layer is electrically connected to the common electrode line;
wherein an angle between an extending direction of the common electrode line and a rubbing direction of the first orientation layer ranges from 0 degrees to 30 degrees or from 60 degrees to 90 degrees, and an angle between an extending direction of the gate line and the rubbing direction of the first orientation layer ranges from 0 degrees to 30 degrees or from 60 degrees to 90 degrees;
wherein the pixel electrode layer comprises a plurality of sub-pixel electrodes arranged in an array; and
the common electrode line comprises a plurality of groups of sub-common electrode lines, the plurality of groups of sub-common electrode lines being arranged in one-to-one correspondence with the plurality of sub-pixel electrodes in a same row, and each group of the plurality of groups of sub-common electrode lines comprising a first sub-common electrode line and a second sub-common electrode line electrically connected to the first sub-common electrode line, wherein an angle between an extending direction of the first sub-common electrode line and the rubbing direction of the first orientation layer ranges from 60 degrees to 90 degrees, and an angle between an extending direction of the second sub-common electrode line and the rubbing direction of the first orientation layer ranges from 0 degrees to 30 degrees.

2. The display panel according to claim 1, wherein:
the gate line comprises a plurality of groups of sub-gate lines, the plurality of groups of sub-gate lines being arranged in one-to-one correspondence with the plurality of sub-pixel electrodes in a same row, and each group of the plurality of groups of sub-gate lines comprising a first sub-gate line and a second sub-gate line electrically connected to the first sub-gate line, wherein an angle between an extending direction of the first sub-gate line and the rubbing direction of the first orientation layer ranges from 0 degrees to 30 degrees, and an angle between an extending direction of the second sub-gate line and the rubbing direction of the first orientation layer ranges from 60 degrees to 90 degrees.

3. The display panel according to claim 2, wherein each of the plurality of sub-pixel electrodes comprises a first edge, a second edge adjacent to the first edge, a third edge opposite to the first edge and a fourth edge opposite to the second edge, wherein the extending direction of the first sub-common electrode line is the same as an extending direction of the first edge, the extending direction of the second sub-common electrode line is the same as an extending direction of the second edge, the extending direction of the first sub-gate line is the same as an extending direction of the fourth edge, and the extending direction of the second sub-gate line is the same as an extending direction of the third edge.

4. The display panel according to claim 1, wherein:
an orthographic projection of the first sub-common electrode line on the substrate does not overlap with an orthographic projection of a sub-pixel electrode corresponding to the first sub-common electrode line on the substrate; and
an orthographic projection of the second sub-common electrode line on the substrate at least partially overlaps with an orthographic projection of a sub-pixel electrode corresponding to the second sub-common electrode line on the substrate.

5. The display panel according to claim 2, wherein:
an orthographic projection of the first sub-gate line on the substrate does not overlap with an orthographic projection of a sub-pixel electrode corresponding to the first sub-gate line on the substrate; and
an orthographic projection of the second sub-gate line on the substrate at least partially overlaps with an orthographic projection of a sub-pixel electrode corresponding to the second sub-gate line on the substrate.

6. The display panel according to claim 1, wherein the each group of the plurality of groups of sub-common electrode lines further comprises a first connection portion connected between the first sub-common electrode line and the second sub-common electrode line.

7. The display panel according to claim 2, wherein the each group of the plurality of groups of sub-gate lines further comprises a second connection portion connected between the first sub-gate line and the second sub-gate line.

8. The display panel according to claim 1, wherein:
the extending direction of the common electrode line is substantially parallel or perpendicular to the rubbing direction of the first orientation layer, and the extending direction of the gate line is substantially parallel or perpendicular to the rubbing direction of the first orientation layer.

9. The display panel according to claim 1, wherein a shape of each of the plurality of sub-pixel electrodes is a parallelogram.

10. The display panel according to claim 9, wherein the shape of the each of the plurality of sub-pixel electrodes is a rhombus.

11. The display panel according to claim 3, wherein:
the data line comprises a plurality of groups of sub-data lines, the plurality of groups of sub-data lines being arranged in one-to-one correspondence with the plurality of sub-pixel electrodes in a same column, and each group of the plurality of groups of sub-data lines comprising a first sub-data line and a second sub-data line electrically connected to the first sub-data line, wherein an extending direction of the first sub-data line is the same as an extending direction of the second edge, and an extending direction of the second sub-data line is the same as an extending direction of the third edge.

12. The display panel according to claim 11, wherein:
an orthographic projection of the data line on the substrate does not overlap with an orthographic projection of a sub-pixel electrode corresponding to the data line on the substrate; or
the each group of the plurality of groups of sub-data lines further comprises a third connection portion connected between the first sub-data line and the second sub-data line.

13. The display panel according to claim 11, wherein:
an orthographic projection of the first sub-data line on the substrate at least partially overlaps with an orthographic projection of an adjacent sub-pixel electrode on the substrate, wherein the adjacent sub-pixel electrode is a sub-pixel electrode adjacent to the second edge of the sub-pixel electrode corresponding to the data line; and
an orthographic projection of the second sub-data line on the substrate at least partially overlaps with an orthographic projection of another adjacent sub-pixel electrode on the substrate, wherein the another adjacent sub-pixel electrode is a sub-pixel electrode adjacent to the third edge of the sub-pixel electrode corresponding to the data line.

14. The display panel according to claim 2, further comprising:
a shielding layer on a side of the common electrode layer away from the substrate, wherein the shielding layer comprises a plurality of shielding units, the plurality of shielding units being arranged in one-to-one correspondence with the plurality of sub-pixel electrodes, and each shielding unit of the plurality of shielding units comprising a first portion, a second portion adjacent to the first portion, a third portion opposite to the first portion and a fourth portion opposite to the second portion.

15. The display panel according to claim 14, wherein:
an orthographic projection of the first portion on the substrate covers an orthographic projection of the first sub-common electrode line on the substrate and an orthographic projection of a portion of an adjacent data line on the substrate, one edge of the orthographic projection of the first portion on the substrate is flush with one edge of the orthographic projection of the first sub-common electrode line on the substrate, and another edge of the orthographic projection of the first portion on the substrate is flush with one edge of the orthographic projection of the portion of the adjacent data line on the substrate, wherein the adjacent data line is a data line adjacent to a data line electrically connected to a sub-pixel electrode corresponding to the each shielding unit; or,
an orthographic projection of the second portion on the substrate covers an orthographic projection of the second sub-common electrode line on the substrate and an orthographic projection of a portion of a corresponding data line on the substrate, one edge of the orthographic projection of the second portion on the substrate is flush with one edge of the orthographic projection of the second sub-common electrode line on the substrate, and another edge of the orthographic projection of the second portion on the substrate is flush with one edge of the orthographic projection of the portion of the corresponding data line on the substrate, wherein the corresponding data line is a data line electrically connected to a sub-pixel electrode corresponding to the each shielding unit; or, an orthographic projection of the third portion on the substrate covers an orthographic projection of the second sub-gate line on the substrate and an orthographic projection of another portion of a corresponding data line on the substrate, one edge of the orthographic projection of the third portion on the substrate is flush with one edge of the orthographic projection of the second sub-gate line on the substrate, and another edge of the orthographic projection of the third portion on the substrate is flush with one edge of the orthographic projection of the another portion of the corresponding data line on the substrate, wherein the corresponding data line is a data line electrically connected to a sub-pixel electrode corresponding to the each shielding unit; or, an orthographic projection of the fourth portion on the substrate covers an orthographic projection of the first sub-gate line on the substrate and an orthographic projection of another portion of an adjacent data line on the substrate, one edge of the orthographic projection of the fourth portion on the substrate is flush with one edge of the orthographic projection of the first sub-gate line on the substrate, and another edge of the orthographic projection of the fourth portion on the substrate is flush with one edge of the orthographic projection of the another portion of the adjacent data line on the substrate, wherein the adjacent data line is a data line adjacent to a data line electrically connected to a sub-pixel electrode corresponding to the each shielding unit.

16. The display panel according to claim 14, wherein:
orthographic projections of the common electrode line, the data line and the gate line on the substrate are inside an orthographic projection of the shielding layer on the substrate, and an area of the orthographic projections of the common electrode line, the data line and the gate line on the substrate is less than an area of the orthographic projection of the shielding layer on the substrate.

17. A display panel, comprising:
a substrate;
a common electrode line and a gate line on the substrate, wherein the common electrode line is isolated from the gate line;
a first insulating layer covering the common electrode line and the gate line;
a data line on a side of the first insulating layer away from the substrate;
a second insulating layer covering the data line;
a pixel electrode layer on a side of the second insulating layer away from the substrate;
a first orientation layer on a side of the pixel electrode layer away from the substrate;
a liquid crystal layer on a side of the first orientation layer away from the substrate;
a second orientation layer on a side of the liquid crystal layer away from the substrate; and
a common electrode layer on a side of the second orientation layer away from the substrate, wherein the common electrode layer is electrically connected to the common electrode line;
wherein an angle between an extending direction of the common electrode line and a rubbing direction of the first orientation layer ranges from 0 degrees to 30 degrees or from 60 degrees to 90 degrees, and an angle between an extending direction of the gate line and the rubbing direction of the first orientation layer ranges from 0 degrees to 30 degrees or from 60 degrees to 90 degrees;
wherein at least a portion of the gate line, at least a portion of the common electrode line, at least a portion of the data line and the pixel electrode layer are in a display area of the display panel; and
the display panel further comprises:
a first conductive layer located in a same layer as the common electrode line and located in a peripheral area, wherein the first conductive layer is connected to the common electrode line and extends along a direction from the display area to the peripheral area, and the peripheral area is on at least one side of the display area;
a second conductive layer located in a same layer as the data line and located in the peripheral area, wherein the second conductive layer extends along the direction from the display area to the peripheral area; and
a third conductive layer located in a same layer as the pixel electrode layer and located in the peripheral area, wherein the third conductive layer extends along the direction from the display area to the peripheral area.

18. The display panel according to claim 17, wherein:
the first conductive layer is electrically connected to the third conductive layer through a first conductive via hole, the third conductive layer is electrically connected to the second conductive layer through a second conductive via hole, and the third conductive layer is electrically connected to the common electrode layer through a metal ball member.

19. A display device, comprising: the display panel according to claim 1.

* * * * *